(12) United States Patent
Ting

(10) Patent No.: US 7,745,825 B2
(45) Date of Patent: Jun. 29, 2010

(54) PIXEL STRUCTURE AND METHOD FOR FORMING THE SAME

(75) Inventor: Yu-Hsin Ting, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 95 days.

(21) Appl. No.: 11/902,229

(22) Filed: Sep. 20, 2007

(65) Prior Publication Data

US 2008/0246042 A1 Oct. 9, 2008

(30) Foreign Application Priority Data

Apr. 3, 2007 (TW) ............................. 96111888 A

(51) Int. Cl.
*H01L 29/04* (2006.01)
(52) U.S. Cl. ............................. 257/59; 257/71; 257/72
(58) Field of Classification Search .................... 257/59, 257/71, 72
See application file for complete search history.

(56) References Cited

U.S. PATENT DOCUMENTS

| 5,182,661 A * | 1/1993 | Ikeda et al. .................... 349/38 |
| 5,724,107 A | 3/1998 | Nishikawa et al. |
| 5,734,449 A * | 3/1998 | Jang ............................. 349/39 |
| 5,745,195 A | 4/1998 | Zhang |
| 5,923,390 A | 7/1999 | Jung Mok et al. |
| 6,137,551 A * | 10/2000 | Jeong .......................... 349/38 |
| 6,576,504 B2 | 6/2003 | Ohtani et al. |
| 2004/0004221 A1 | 1/2004 | Murade |
| 2006/0050191 A1 | 3/2006 | Park et al. |
| 2006/0061701 A1 | 3/2006 | Chang |

FOREIGN PATENT DOCUMENTS

JP          04-335617          11/1992

* cited by examiner

*Primary Examiner*—Long Pham
(74) *Attorney, Agent, or Firm*—Bacon & Thoams, PLLC

(57) ABSTRACT

A pixel structure comprising at least one transistor, a first storage capacitor, a first conductive layer, an interlayer dielectric layer, a second conductive layer, a passivation layer, and a third conductive layer is provided. The first storage capacitor is electrically connected to the transistor. The interlayer dielectric layer having at least one first opening covers the first conductive layer. The second conductive layer is formed on a part of the interlayer dielectric layer and is electrically connected to the first conductive layer through the first opening. The passivation layer having at least one second opening covers the transistor and the second conductive layer. The third conductive layer is formed on a part of the passivation layer and is electrically connected to the transistor through the second opening. The first storage capacitor is formed by the third conductive layer, the passivation layer, and the second conductive layer.

12 Claims, 18 Drawing Sheets

PIXEL STRUCTURE AND METHOD FOR FORMING THE SAME

This application claims the benefit of priority based on Taiwan Application Number 96111888, filed Apr. 3, 2007, the subject matter of which is incorporated herein by reference in its entirety.

BACKGROUND OF THE INVENTION

1. Field of the Invention

The present invention relates in general to a pixel structure and a method for forming the same, and more particularly, to a pixel structure having a storage capacitor.

2. Description of the Related Art

Referring to FIG. 1, a cross-sectional view of a conventional pixel structure is shown. The pixel structure 100 has a substrate 109 which has a semiconductor layer 120 formed thereon. The semiconductor layer 120 and the substrate 109 are covered by an insulating layer 150. The insulating layer 150 has a gate electrode 116 formed thereon and covered by an interlayer dielectric layer 190. The insulating layer 150 and the interlayer dielectric layer 190 have two openings 162 for exposing the semiconductor layer 120. A source electrode 114, a drain electrode 112 and a capacitance electrode 101 are formed on the interlayer dielectric layer 190. The source electrode 114 and the drain electrode 112 are electrically connected to the semiconductor semiconductor layer 120 through the opening 162.

A passivation layer 102 formed on the interlayer dielectric layer 190 covers the source electrode 114, the drain electrode 112, and the capacitance electrode 101, and the passivation layer 102 has a contact hole 163 for exposing the source electrode 114. The pixel electrode 103 is formed on the passivation layer 102 and is electrically connected to the source electrode 114 through the contact hole 163.

The capacitance electrode 101 of the pixel structure 100 is made of a conductive material, and the passivation layer 102 is made of a dielectric material. The storage capacitor $C_{s1}$ is formed between the capacitance electrode 101 and the pixel electrode 103. However, due to the covering method of the passivation layer 102, the pixel electrode 103 and the capacitance electrode 101 are easily short-circuited during the manufacturing process. Despite the above problem can be resolved by increasing the thickness of the passivation layer 102, the storage capacitor $C_{s1}$ is decreased relatively.

Besides, the capacitance electrode 101 is made of a non-transparent material and is located within a visible area (not illustrated in the diagram) of the pixel structure 100. Despite the pixel electrode 103 is made of a transparent material, such design enables the aperture ratio of the pixel structure 100 to decrease because of the increase in the storage capacity of the storage capacitor $C_{s1}$ (such as the area of the storage capacitor $C_{s1}$ capacitor $C_{s1}$ within the visible area), resulting in a decrease in the brightness of a panel. Such problem arises more often in a panel of the same size but with higher resolution.

SUMMARY OF THE INVENTION

The present invention is directed to a pixel structure and a method for forming the same is adapted to increase the aperture ratio without changing the storage capacitance of a storage capacitor.

According to a first aspect of the present invention, a pixel structure comprising at least one transistor, a first storage capacitor, a first conductive layer, an interlayer dielectric layer, a second conductive layer, a passivation layer and a third conductive layer is provided. The first storage capacitor is electrically connected to the transistor. The interlayer dielectric layer having at least one first opening covers the first conductive layer. The second conductive layer is formed on a part of the interlayer dielectric layer and is electrically connected to the first conductive layer through the first opening. The passivation layer having at least one second opening covers the transistor and the second conductive layer. The third conductive layer is formed on a part of the passivation layer and is electrically connected to the transistor through the second opening. The first storage capacitor is formed by the third conductive layer, the passivation layer, and the second conductive layer.

According to a second aspect of the present invention, a method for forming a pixel structure is provided. The pixel structure has at least one transistor and a first storage capacitor. The first storage capacitor is electrically connected to the transistor. The method comprises: forming a first conductive layer; covering an interlayer dielectric layer having a first opening on the first conductive layer; forming a second conductive layer on a part of the interlayer dielectric layer; electrically connecting the second conductive layer to the first conductive layer through the first opening; covering a passivation layer having a second opening on the transistor and the second conductive layer; forming a third conductive layer on a part of the passivation layer; and electrically connecting the third conductive layer to the transistor through the second opening. The first storage capacitor is formed by the third conductive layer, the passivation layer, and the second conductive layer.

The present invention will become apparent from the following detailed description of the preferred but non-limiting embodiments. The following description is made with reference to the accompanying drawings.

DETAILED DESCRIPTION OF THE INVENTION

The present invention provides a pixel structure having at least one storage capacitor between conductive materials. Examples of the conductive materials comprise a transparent material, a reflective material, or a combination thereof. Embodiments of the present invention are exemplified by a pixel structure of a display panel of an electro-optical device. Furthermore, some elements are omitted in the diagrams of the embodiments such that the technical features of the present invention are elaborated more clearly.

First Embodiment

Figure 1:
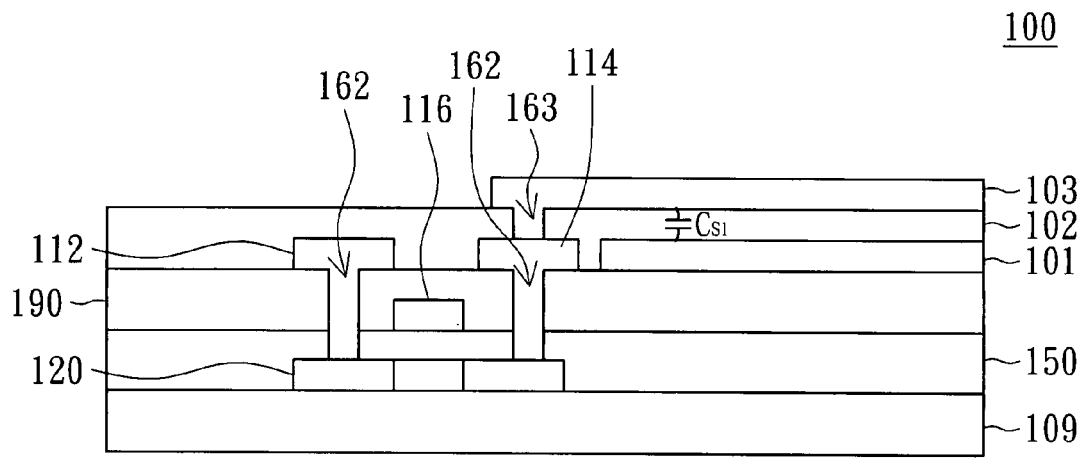
FIG. 1 (Related art) is a cross-sectional view of a conventional pixel structure.
Figure 2A:
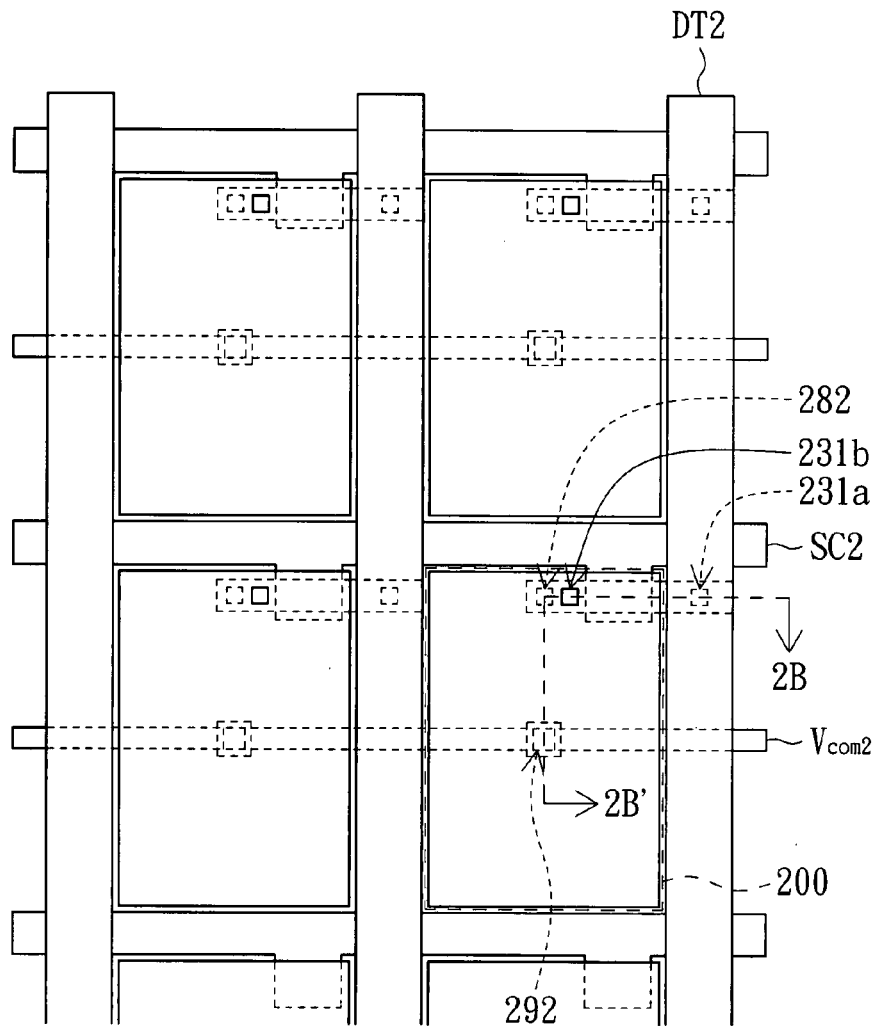
FIG. 2A is a top view of a pixel structure according to a first embodiment of the present invention.
Figures 2B, 3A, 3B:
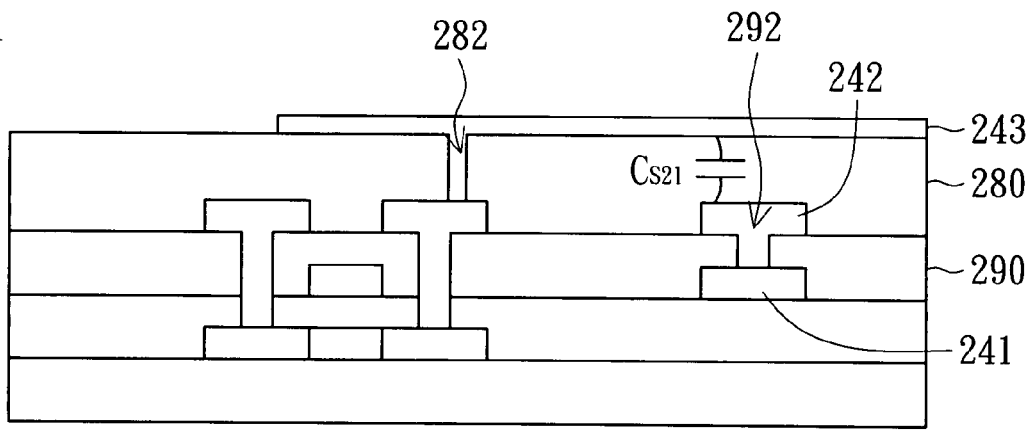
FIG. 2B is a cross-sectional view of the pixel structure of FIG. 2A.
FIGS. 3A~3F are flowcharts of a method for forming the pixel structure of FIG. 2B.

Referring to FIG. 2A, a top view of a pixel structure according to a first embodiment of the present invention is shown. The present embodiment of the invention is exemplified by a pixel structure 200 of a display panel of an electro-optical device. As indicated in FIG. 2A, a data line DT2 and a scan line SC2 are electrically connected to the pixel structure 200, respectively. Referring to FIG. 2B, a cross-sectional view of the pixel structure of FIG. 2A is shown. FIG. 2B is a cross-sectional view along the cross-sectional line 2B-2B' of FIG. 2A. The pixel structure 200 comprises a transistor (not numbered in the diagram), a first storage capacitor $C_{s21}$, a first conductive layer 241, an interlayer dielectric layer 290, a second conductive layer 242, a passivation layer 280, and a third conductive layer 243. Preferably, the pixel structure 200 selectively comprises a light-shading patterned layer (not illustrated in the diagram) located and substantially paralleled a side of at least one of the data line DT2 and the scan line SC2, so as to avoid the light-leakage occurring to an edge of at least one of the data line DT2 and the scan line SC2.

The first storage capacitor $C_{s21}$ is electrically connected to the transistor. The interlayer dielectric layer 290 having an opening 292 covers the first conductive layer 241. The second conductive layer 242 is formed on a part of the interlayer dielectric layer 290 and is electrically connected to the first conductive layer 241 through the opening 292. The passivation layer 280 having an opening 282 covers the transistor and the second conductive layer 242. The third conductive layer 243 is formed on a part of the passivation layer 280 and is electrically connected to the transistor through the opening the opening 282. The first storage capacitor $C_{s21}$ is formed by the third conductive layer 243, the passivation layer 280, and the second conductive layer 242.

Referring to FIGS. 3A~3F, flowcharts of a method for forming the pixel structure of FIG. 2B are shown. The method for forming the pixel structure 200 is stated below. As indicated in FIG. 3A, a semiconductor layer 220 is formed on a substrate 209, and then the semiconductor layer 220 is covered by an insulating layer 250. The semiconductor layer 220 comprises at least two doping regions 224a and 224b and an intrinsic region 222. Generally, the intrinsic region 222 is located between the two doping regions 224a and 224b. Preferably, the present embodiment of the invention can selectively add at least one additional doping region between the intrinsic region 222 and at least one of the two doping regions 224a and 224b, and the doping concentration of the additional doping region is substantially less than at least one of the two doping regions 224a and 224b. The intrinsic region 222 may or may not be doped. If the intrinsic region 222 is doped, preferably, the polarity of the intrinsic region 222 is substantially different from the polarity of the two doping regions 224a and 224b and the additional doping region. Besides, the two doping regions 224a and 224b, the intrinsic region 222 and/or the additional doping region can be selectively formed in the semiconductor layer 220 at the same time or not at the same time. Furthermore, the material of the semiconductor layer 220 comprises a single-crystal silicon-containing material, a micro-crystal silicon-containing material, a poly-crystal material, a poly-crystal silicon-containing material, an amorphous silicon-containing material, a germanium-containing material, other materials, or any combination thereof.

As indicated in FIG. 3B, the first conductive layer 241 is formed on the insulating layer 250; meanwhile, a gate electrode 216 of the transistor is formed. In the present embodiment of the invention, the first conductive layer 241 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The first conductive layer 241 can be selectively made of a transparent material (such as indium tin oxide, aluminum zinc oxide, aluminum tin oxide, indium zinc oxide, cadmium tin oxide, other materials, or any combination thereof) or a combination of a transparent material and a reflective material. Besides, the first conductive layer 241 is connected to an electrode line having potential (such as a common electrode line $V_{com2}$). Or a part of an electrode line having potential is used by the first conductive layer 241 (such as the common electrode line $V_{com2}$ is as the first conducitve layer 241, as shown in FIG. 2A). In the present embodiment of the invention, the electrode line such as the common electrode line $V_{com2}$ is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) combination thereof) but is not limited thereto. The electrode line can be selectively made of a transparent material (such as indium tin oxide, aluminum zinc oxide, aluminum tin oxide, indium zinc oxide, cadmium tin oxide, other materials, or any combination thereof), or a combination of a transparent material and a reflective material. In other words, the first conductive layer 241 is connected to the electrode line such as the common electrode line $V_{com2}$ made of the substantially identical material to the first conductive layer 241 or the substantially different material from the first conductive layer 241. Preferably, the materials of the electrode line and the first conductive layer 124 are substantially identical such that the manufacturing process is simplified.

Figure 3C:
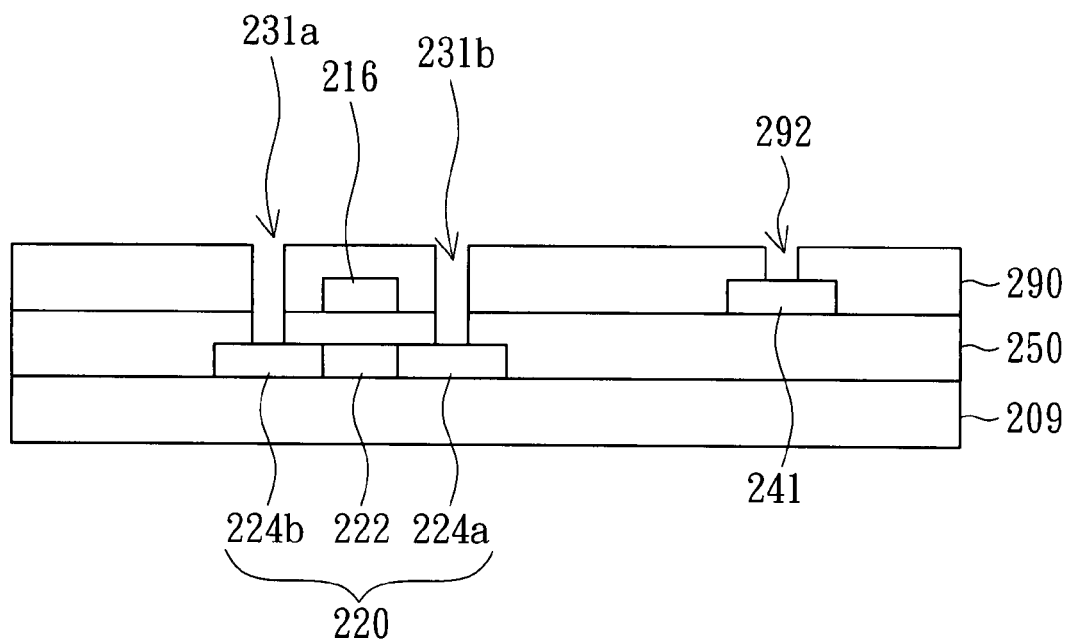

As indicated in FIG. 3C, the insulating layer 250 is covered by the interlayer dielectric layer 290, the opening 292 is formed at the interlayer dielectric layer 290, and two openings 231a and 231b are formed at the interlayer dielectric layer 290 and the insulating layer 250, respectively.

Figure 3D:
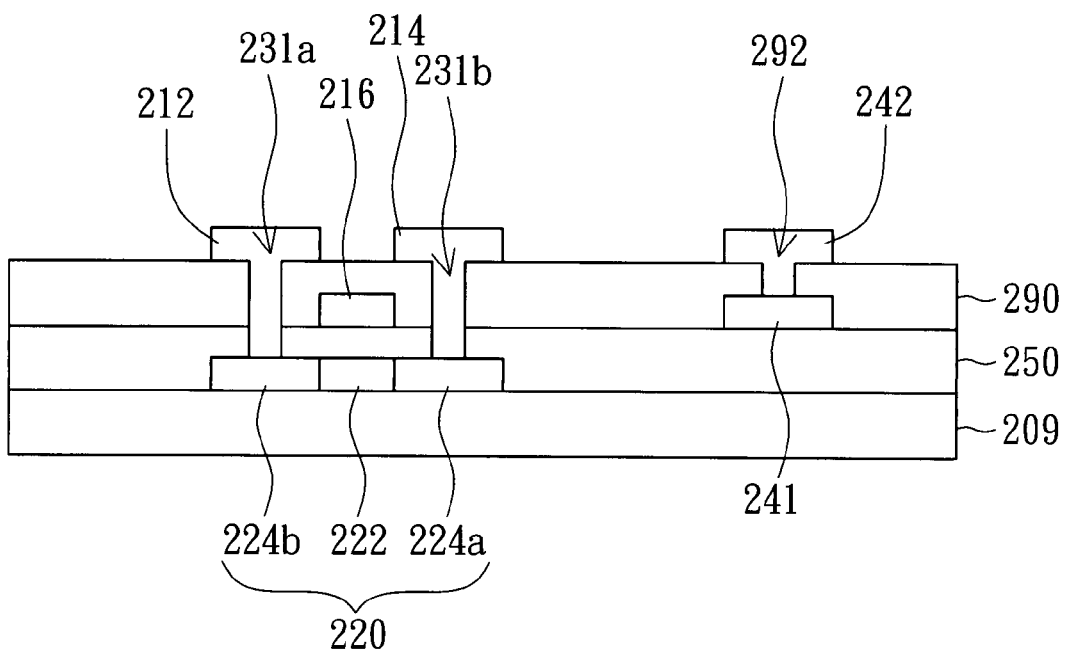

As indicated in FIG. 3D, the second conductive layer 242 is formed on a part of the interlayer dielectric layer 290 and is electrically connected to the first conductive layer 241 and the semiconductor layer 220 through the opening 292 and the openings 231a and 231b, respectively. The second conductive layer 242 electrically connected to the semiconductor layer 220 through the openings 231a and 231b is as a drain electrode 212 of the transistor and a source electrode 214 of the transistor, and a gap (not shown) is formed between the drain electrode 212 and the source electrode 214. In the present embodiment of the invention, the second conductive layer 242 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The second conductive layer 242 can be selectively made of a transparent material (such as indium tin oxide, aluminum zinc oxide, aluminum tin oxide, indium zinc oxide, cadmium tin oxide, other materials, or any combination thereof), or a combination of a transparent material and a reflective material. Furthermore, one of the source electrode 214 of the transistor and the drain electrode 212 of the transistor is electrically connected to the data line DT2 (as indicated in FIG. 2A), and the gate electrode 216 of the transistor is electrically connected to the scan line SC2 (as indicated in FIG. 2A). It is noted that the openings 231a, 231b, and 292 of the present embodiment of the invention are not formed at the same time but are not limited thereto. The openings 231a, 231b, and 292 can be selectively formed at the same time by a photo process with masks having different transparency (such as a halftone mask, a diffracting mask, a grid-patterned mask, other masks, or a combination thereof).

Figure 3E:
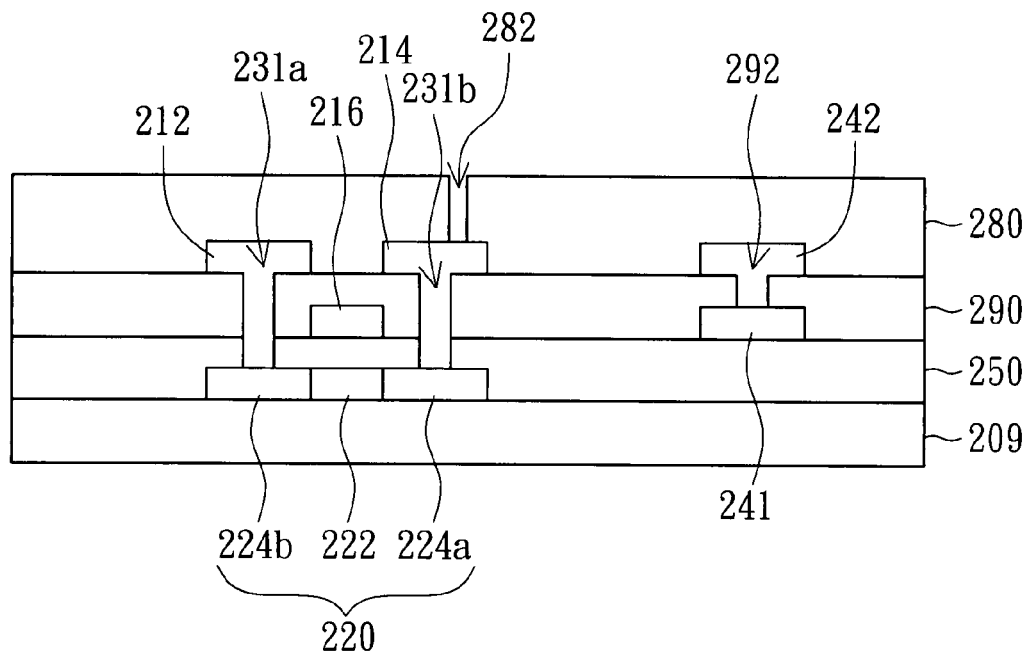

As indicated in FIG. 3E, the passivation layer 280 having the opening 282 covers the transistor and the second conductive layer 242.

Figure 3F:
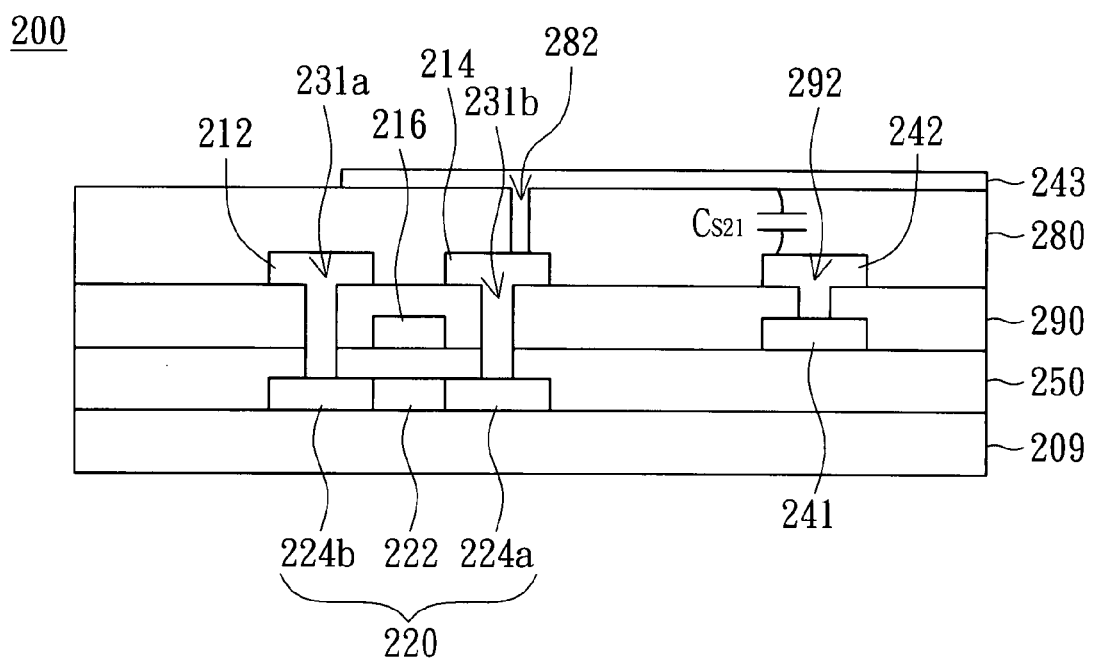

As indicated in FIG. 3F, the third conductive layer 243 (also called the pixel electrode) is formed on a part of the passivation layer 280 and is electrically connected to the transistor through the opening 282. The opening 282 can be substantially aligned with or not aligned with the opening 231b. Thus, the entire pixel structure 200 is like what is illustrated in FIG. 3F. In the present embodiment of the invention, the third conductive layer 243 is made of a transparent material (such as indium tin oxide, aluminum zinc oxide, aluminum tin oxide, indium zinc oxide, cadmium tin oxide, other materials, or any combination thereof) but is not limited thereto. The third conductive layer 243 can be selectively made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) or a combination of a transparent material and a reflective material.

In the present embodiment of the invention, the first conductive layer 241 and the second conductive layer 242 are resistors with common potential. That is to say, the first conductive layer 241 and the second conductive layer 242 are connected in parallel, such that the load impedance of the electrode line such as the common electrode line $V_{com2}$ is reduced, hence avoiding cross-talk which occurs when a frame is displayed on the display panel of the electro-optical device.

Furthermore, at least one of the insulating layer 250, the interlayer dielectric layer 290 and the passivation layer 280 comprises an inorganic material (such as silicon oxide ($Si_xO_y$), silicon nitride ($Si_xN_y$), silicon oxy-nitride ($SiO_xN_y$), hafnium oxide ($HfO_x$), hafnium nitride ($HfN_x$), silicon carbide (SiC), other materials, or any combination thereof), organic materials (such as photo-resistance, polyarylene ether (PAE), polyimide, polyester, polyglycol, polyolefines, benzocyclclobutene (BCB), hydrogen silsesquioxane (HSQ), methyl silsesquioxane (MSQ), SiOC-H, other materials, or any combination thereof), or a combination thereof.

Figure 4:
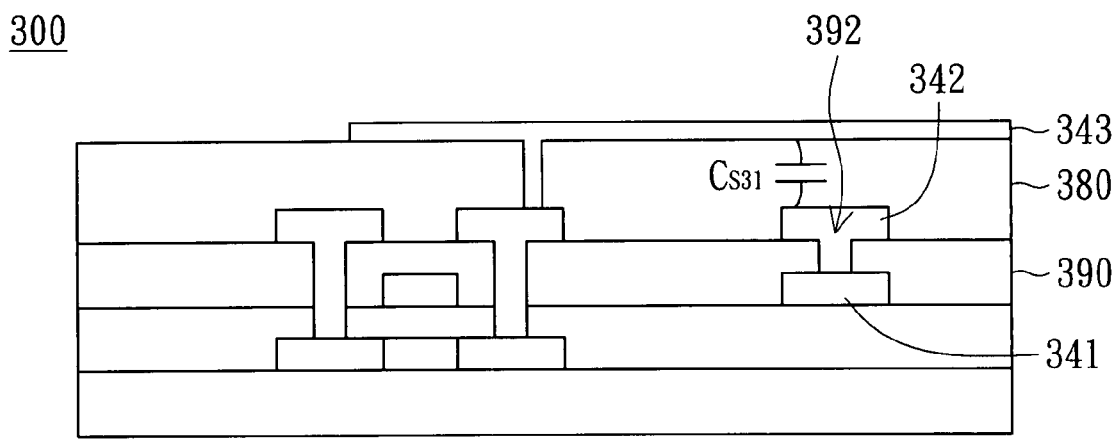
FIG. 4 is a cross-sectional view of another pixel structure of the first embodiment.

In the present embodiment of the invention, the second conductive layer 242 is selectively made of a reflective material, a transparent material, or a combination thereof. The second conductive layer 242 of FIG. 2B is made of a reflective material as an example. Referring to FIG. 4, a cross-sectional view of another pixel structure of the first embodiment is shown. The pixel structure 300 comprises a transistor (not numbered in the diagram), a first storage capacitor $C_{s31}$, a first conductive layer 341, an interlayer dielectric layer 390, a second conductive layer 342, a passivation layer 380 and a third conductive layer 343. The second conductive layer 342 is formed on a part of the interlayer dielectric layer 390 and is electrically connected to the first conductive layer 341 through an opening 392. The second conductive layer 242 of FIG. 2B is made of a reflective material, and the second conductive layer 342 of FIG. 4 is made of a transparent material as an example, but is not limited thereto. The above disclosure is the method for forming the pixel structure 200, and the method for forming the pixel structure 300 which is the same with the method for forming the pixel structure 200 is not repeated here. It is noted that the material of the second conductive layer 242 of the pixel conductive layer 242 of the pixel structure 200 and the material of the second conductive layer 342 of the pixel structure 300 are not the same. Similarly, the pixel structure 300 is formed according to the above-mentioned method. As the second conductive layer 342 of the pixel structure 300 is made of a transparent material, the pixel structure 300 is applicable to different embodiments.

Second Embodiment

Figure 5A:
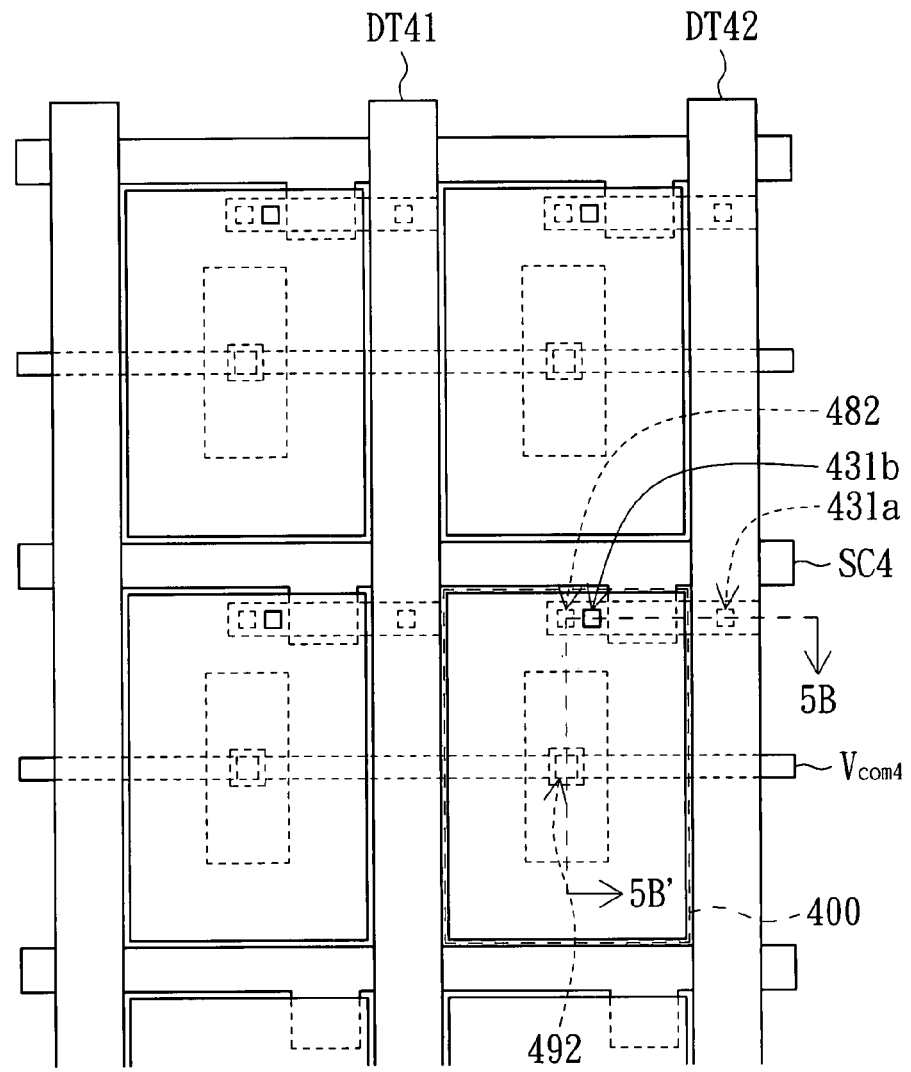
FIG. 5A is a top view of a pixel structure according to a second embodiment of the present invention.
Figure 5B:
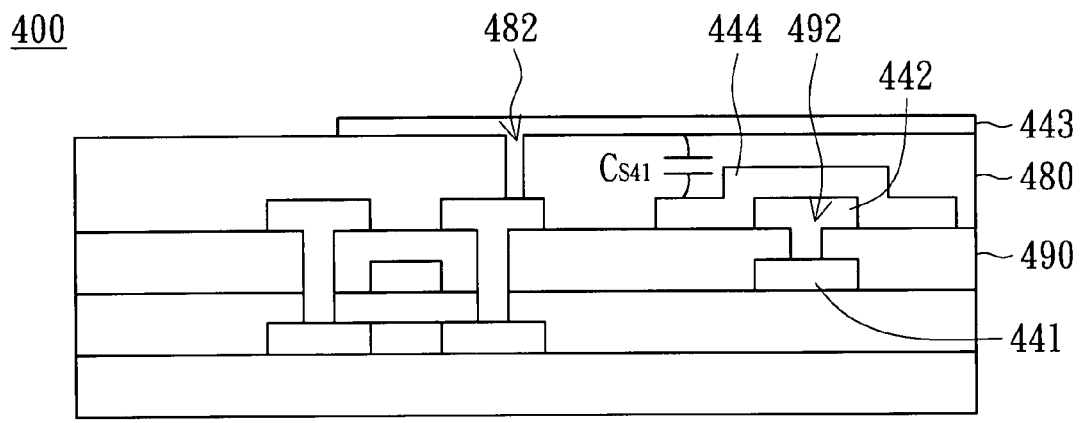
FIG. 5B is a cross-sectional view of the pixel structure of FIG. 5A.

Referring to FIG. 5A, a top view of a pixel structure according to a second embodiment of the present invention is shown. The present embodiment of the invention is exemplified by a pixel structure 400 of a display panel of an electro-optical device. As indicated in FIG. 5A, data lines DT41 and DT42 and a scan line SC4 are electrically connected to the pixel structure 400, respectively. Referring to FIG. 5B, a cross-sectional view of the pixel structure of FIG. 5A is shown. FIG. 5B is a cross-sectional view along the cross-sectional line 5B-5B' of FIG. 5A. The pixel structure 400 comprises a transistor (not numbered in the diagram), a first storage capacitor $C_{s41}$, a first conductive layer 441, an interlayer dielectric layer 490, a second conductive layer 442, a passivation layer 480, a third conductive layer 443, and a fourth conductive layer 444. Preferably, the pixel structure 400 selectively comprises a light-shading patterned layer (not illustrated in the diagram) located and substantially paralleled a side of at least one of the data lines DT41 and DT42 and the scan line SC4, so as to avoid the light-leakage occurring to an edge of at least one of the data lines DT41 and DT42 and the scan line SC4.

The first storage capacitor $C_{s41}$ is electrically connected to the transistor. The interlayer dielectric layer 490 having an opening 492 covers the first conductive layer 441. The second conductive layer 442 is formed on a part of the interlayer dielectric layer 490 and is electrically connected to the first conductive layer 441 through an opening 492. The passivation layer 480 having an opening 482 covers the transistor and the second conductive layer 442. The third conductive layer 443 is formed on a part of the passivation layer 480 and is electrically connected to the transistor through the opening 482. The fourth conductive layer 444 covers the second conductive layer 442 and a part of the interlayer dielectric layer 490, such that the first storage capacitor $C_{s41}$ is formed by the third conductive layer 443, the passivation layer 480, the fourth conductive layer 444, and the second conductive layer 442.

Figure 6A:
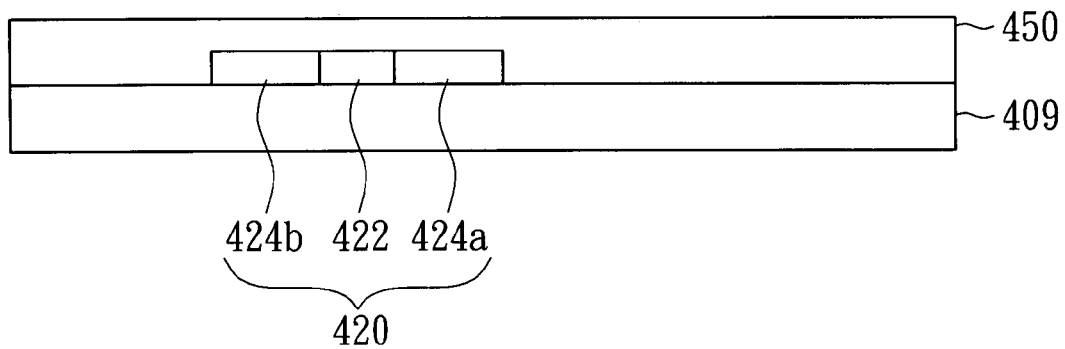
FIGS. 6A~6G are flowcharts of a method for forming the pixel structure of FIG. 5B.

Referring to FIGS. 6A~6G, flowcharts of a method for forming the pixel structure of FIG. 5B are shown. The method for forming the pixel structure 400 is stated below. As indicated in FIG. 6A, a semiconductor layer 420 is formed on a substrate 409, and then the semiconductor layer 420 is covered by an insulating layer 450. The semiconductor layer 420 comprises at least two doping regions 424a and 424b and an intrinsic region 422. Generically, the intrinsic region 422 is located between the two doping regions 424a and 424b. Preferably, the present embodiment of the invention can selectively add at least one additional doping region between the intrinsic region 422 and at least one of the two doping regions 424a and 424b, and the doping concentration of the additional doping region is substantially less than at least one of the two doping regions 424a and 424b. The intrinsic region 422 may or may not be doped. If the intrinsic region 422 is doped, preferably, the polarity of the intrinsic region 422 is substantially different from the polarity of the two doping regions 424a and 424b and the additional doping region. Besides, the two doping regions 424a and 424b, the intrinsic region 422 and/or the additional doping region can be selectively formed in the semiconductor layer 420 at the same time or not at the same time. Furthermore, the material of the semiconductor layer 420 comprises a single-crystal silicon-containing material, a micro-crystal silicon-containing material, a poly-crystal silicon-containing material, an amorphous silicon-containing material, a germanium-containing material, other materials, or any combination thereof.

Figure 6B:
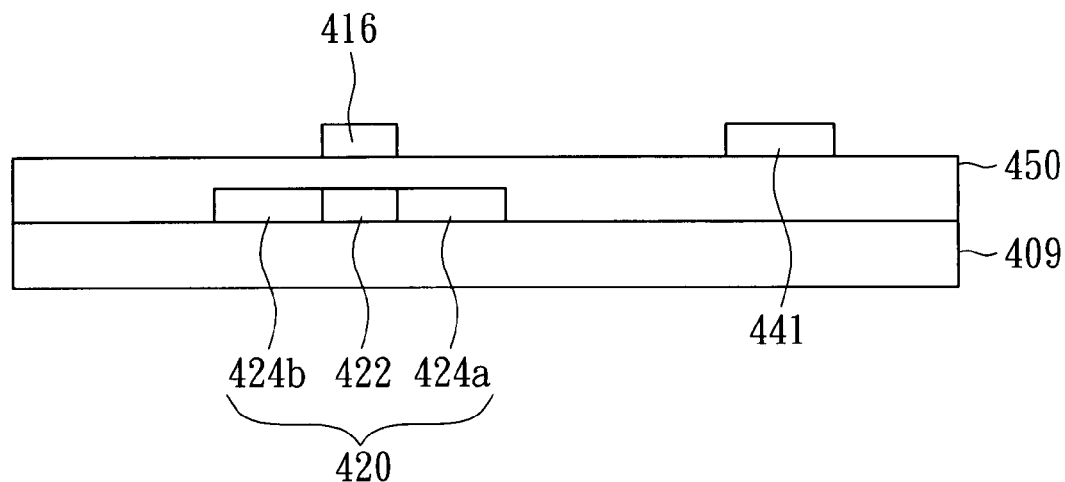

As indicated in FIG. 6B, the first conductive layer 441 is formed on the insulating layer 450; meanwhile, a gate electrode 416 of the transistor is formed. In the present embodiment of the invention, the first conductive layer 441 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The first conductive layer 441 can be selectively made of a transparent material (such as indium tin oxide, aluminum zinc oxide, aluminum tin oxide, indium aluminum tin oxide, indium zinc oxide, cadmium tin oxide, other materials, or any combination thereof) or a combination of a transparent material and a reflective material. Besides, the first conductive layer 441 is connected to an electrode line having potential (such as a common electrode line $V_{com4}$ as indicated in FIG. 5A) but is not limited thereto. A part of an electrode line having potential is used by the first conductive layer 441 (such as the common electrode line $V_{com4}$ is as the first conductive layer 441). In the present embodiment of the invention, the electrode line such as the common electrode line $V_{com4}$ is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof), but is not limited thereto. The electrode line can be selectively made of a transparent material (such as indium tin oxide, aluminum zinc oxide, aluminum tin oxide, indium zinc oxide, cadmium tin oxide, other materials, or any combination thereof), or a combination of a transparent material and a reflective material. In other words, the first conductive layer 441 is connected to the electrode line such as the common electrode line $V_{com4}$ made of the substantially identical material to the first conductive layer 241 or the substantially different material from the first conductive layer 241. Preferably, the materials of the electrode line and the first conductive layer 441 are substantially identical such that the manufacturing process is simplified.

Figure 6C:
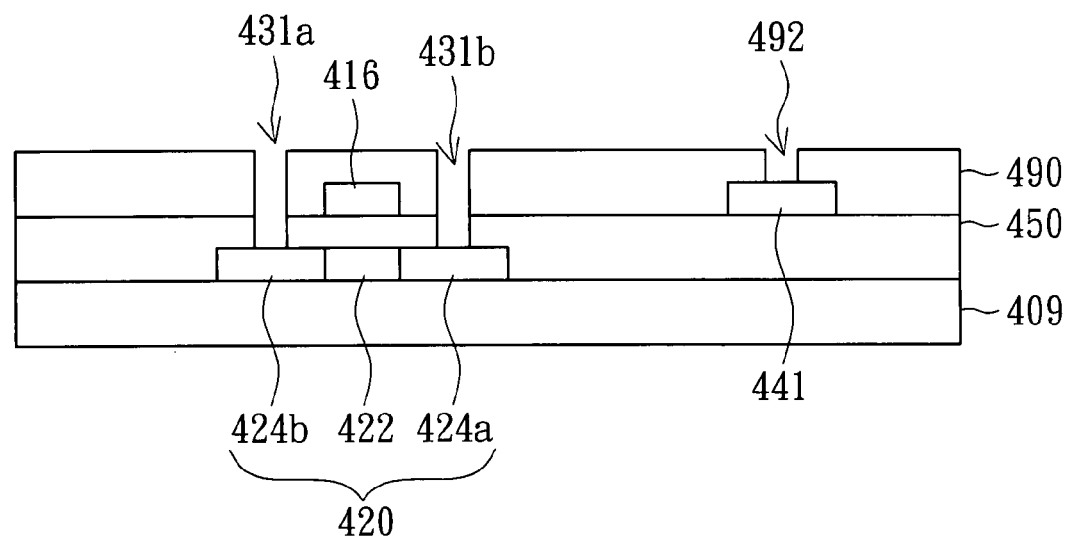

As indicated in FIG. 6C, the insulating layer 450 is covered by the interlayer dielectric layer 490, the opening 492 is formed at the interlayer dielectric layer 490, and two openings 431a and 431b are formed at the interlayer dielectric layer 490 and the insulating layer 450, respectively.

Figure 6D:
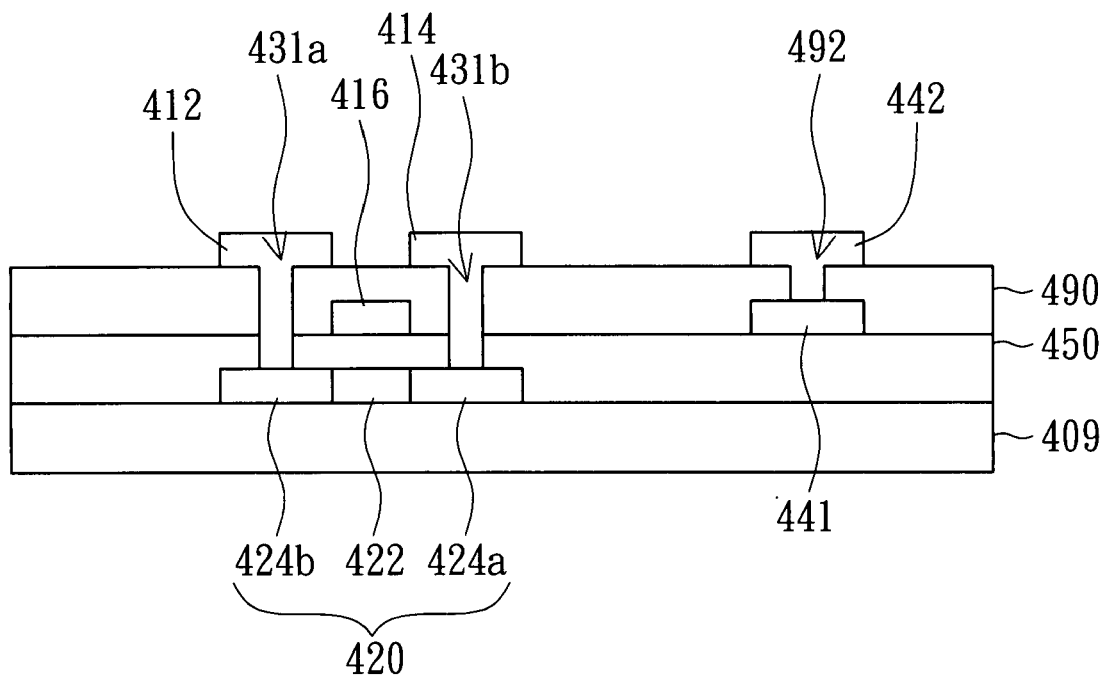

As indicated in FIG. 6D, the second conductive layer 442 is formed on a part of the interlayer dielectric layer 490 and is electrically connected to the first conductive layer 441 and the semiconductor layer 420 through the opening 492 and the openings 431a and 431b, respectively. The second conductive layer 442 electrically connected to the semiconductor layer 420 through the openings 431a and 431b is as a drain electrode 412 of the transistor and a source electrode 414 of the transistor, and a gap (not shown) is formed between the drain electrode 412 and the source electrode 414. In the present embodiment of the invention, the second conductive layer 442 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The second conductive layer 442 can be selectively made of a transparent material (such as indium tin oxide, aluminum zinc oxide, aluminum tin oxide, indium zinc oxide, cadmium tin oxide, other materials, or any combination thereof), or a combination of a transparent material and a reflective material. Furthermore, one of the drain electrode 412 of the transistor and the source electrode 414 of the transistor is electrically connected to the data lines DT41 and DT42 (as indicated in FIG. 5A), and the gate electrode 416 of the transistor is electrically connected to the scan line SC4 (as indicated in FIG. 5A). It is noted that the openings 431a, 431b, and 492 of the present embodiment of the invention are not formed at the same time but are not limited thereto. The openings 431a, 431b and 492 can be selectively formed at the same time by a photo process with masks having different transparency (such as a halftone mask, a diffracting mask, a grid-patterned mask, other masks, or a combination thereof).

Figure 6E:
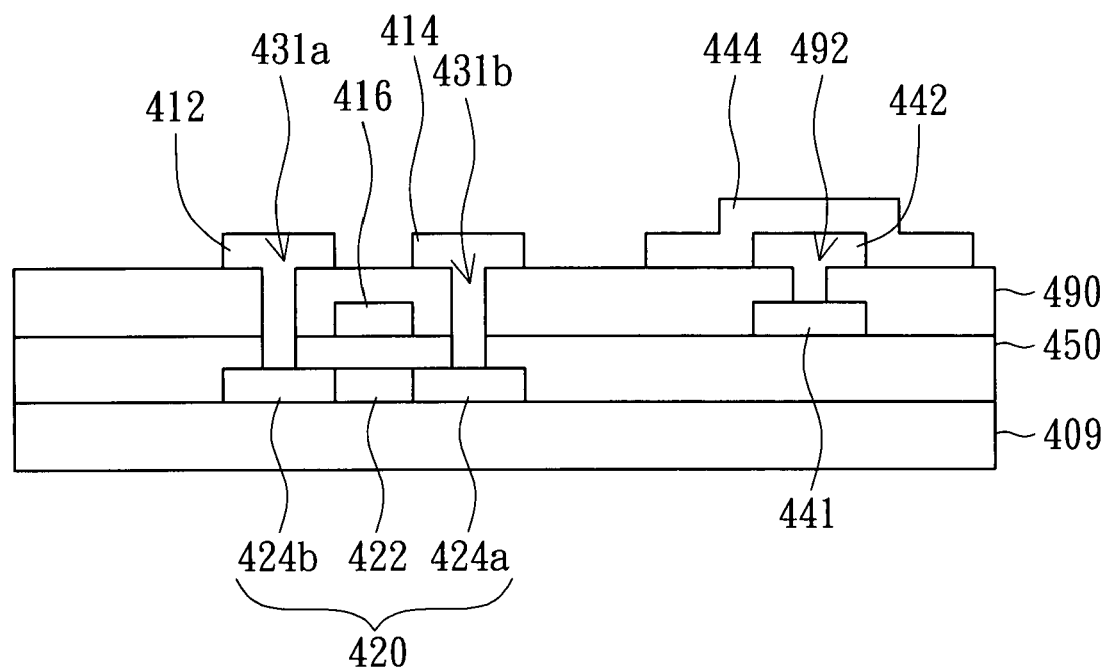

As indicated in FIG. 6E, the fourth conductive layer 444 covers the second conductive layer 442 and a part of the interlayer dielectric layer 490. In the present embodiment of the invention, the fourth conductive layer 444 is made of a transparent material but is not limited thereto. The fourth conductive layer 444 can be selectively made of a reflective material or a combination of a transparent material and a reflective material. Besides, the first conductive layer 441, the second conductive layer 442 and the fourth conductive layer 444 are electrically connected together, such that the first conductive layer 441, the second conductive layer 442 and the fourth conductive layer 444 have substantially identical potential, for example, the first conductive layer 441, the potential of the second conductive layer 442, and the fourth conductive layer 444 is the common potential.

Besides, in the present embodiment of the invention, there is a first parasitic capacitance between the drain electrode 412 and the scan line SC4, and the sum of the capacitance between the drain electrode 412 and each of the data lines DT41 and DT42 is substantially equal to a second parasitic capacitance. In the pixel structure 400, there is a liquid crystal capacitance (not illustrated) between a pixel electrode and a common electrode (not illustrated) is formed on another substrate (not shown) corresponding to the substrate 409. A pixel capacitance of the pixel structure 400 is substantially equal to the sum of the liquid crystal capacitance and the first storage capacitor $C_{s41}$. The area of the fourth conductive layer 444 is determined according to the ratio of the first parasitic capacitance to the pixel capacitance, the ratio of the second parasitic capacitance to the pixel capacitance, and the ratio of the first storage capacitor $C_{s41}$ to the liquid crystal capacitance. In the present embodiment of the invention, preferably, the area of the fourth conductive layer 444 is substantially greater than the area of the second conductive layer 442, but is not limited thereto. The area of the fourth conductive layer 444 can be selectively changed according to design requirements. For example, the area of the fourth conductive layer 444 is substantially less than the area of the second conductive layer 442, substantially equal to the area of the second conductive layer 442, or the area of a part of the fourth conductive layer 444 is substantially greater than the area of the second conductive layer 442 and the area of another part of the fourth conductive layer 444 is substantially less than or substantially equal to the area of the second conductive layer 442.

Figure 6F:
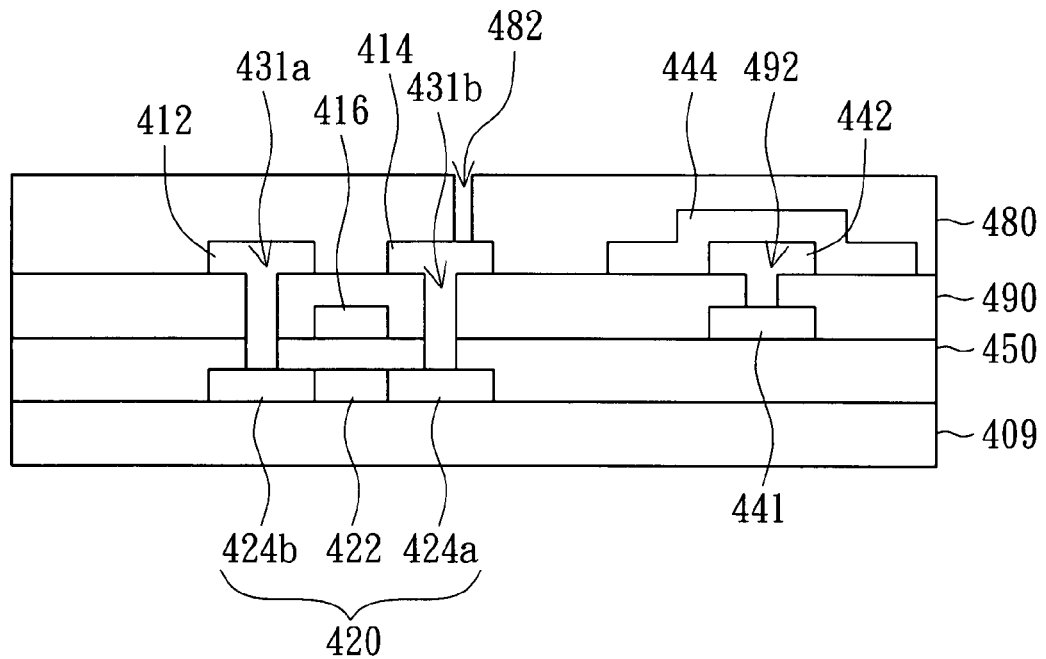

As indicated in FIG. 6F, the passivation layer 480 having the opening 482 covers the transistor and the second conductive layer 442.

Figure 6G:
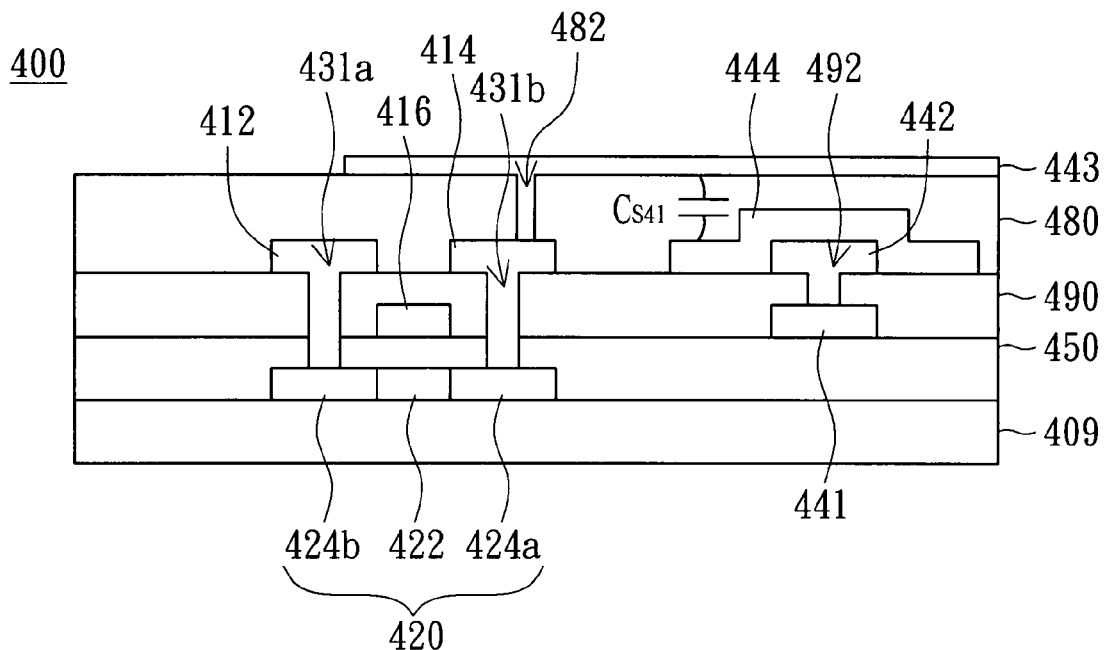

As indicated in FIG. 6G, the third conductive layer 443 (also called the pixel electrode) is formed on a part of the passivation layer 480 and is electrically connected to the transistor through the opening 482. The opening 482 can be substantially aligned with or not aligned with the opening 431*b*. Thus, the entire pixel structure 400 is like what is illustrated in FIG. 6G. In the present embodiment of the invention, the third conductive layer 443 is made of a transparent material (such as indium tin oxide, aluminum zinc oxide, aluminum tin oxide, indium zinc oxide, cadmium tin oxide, other materials, or any combination thereof) but is not limited thereto. The third conductive layer 443 can be selectively made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) or a combination of a transparent material and a reflective material.

In the present embodiment of the invention, the fourth conductive layer 444 is made of a transparent material, so the pixel structure 400 is adapted to increase the aperture ratio without changing the capacitance of the storage capacitors, but is not limited thereto. The fourth conductive layer 444 can also be made of a reflective material, or a combination of a transparent material and a reflective material. Besides, the fourth conductive layer 444 can select not to overlap any gate lines or data lines to reduce the load of the gate line or the data line, but is not limited thereto. The fourth conductive layer 444 can be selectively partly overlapped.

Furthermore, the first conductive layer 441, the second conductive layer 442 and the fourth conductive layer 444 are resistors with common potential. That is to say, the first conductive layer 441, the second conductive layer 442 and the fourth conductive layer 444 are connected in parallel, such that the load impedance of the electrode line such as the common electrode line $V_{com4}$ is reduced, hence avoiding cross-talk which occurs when a frame is displayed on the display panel of the electro-optical device.

Furthermore, at least one of the insulating layer 450, the interlayer dielectric layer 490 and the passivation layer 480 comprises an inorganic material (such as silicon oxide ($Si_xO_y$), silicon nitride ($Si_xN_y$), silicon oxy-nitride ($SiO_xN$), hafnium oxide ($HfO_x$), hafnium nitride ($HfN_x$), silicon carbide (SiC), other materials, or any combination thereof), organic materials (such as photo-resistance, polyarylene ether (PAE), polyimide, polyester, polyglycol, polyolefines, benzocyclclobutene (BCB), hydrogen silsesquioxane (HSQ), methyl silesquioxane (MSQ), SiOC-H, other materials, or any combination thereof), or a combination thereof.

Third Embodiment

Figure 7A:
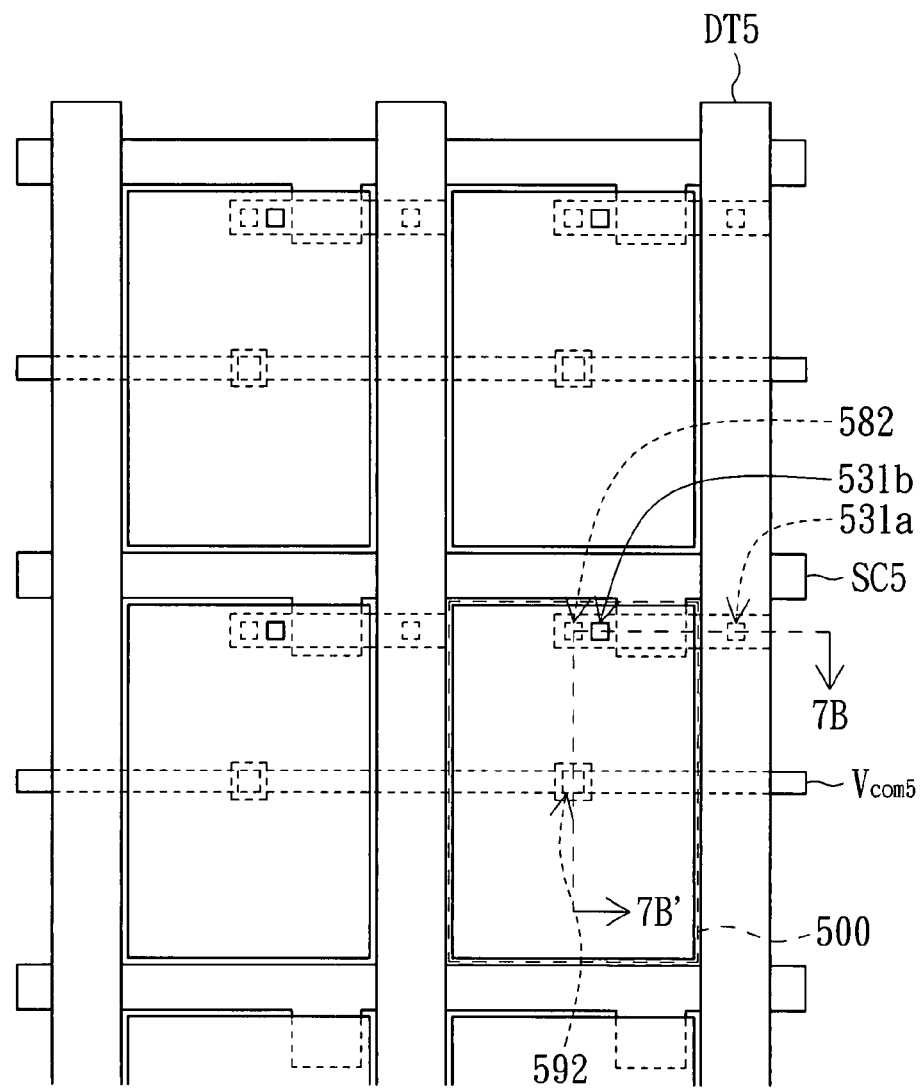
FIG. 7A is a top view of a pixel structure according to a third embodiment of the present invention.
Figure 7B:
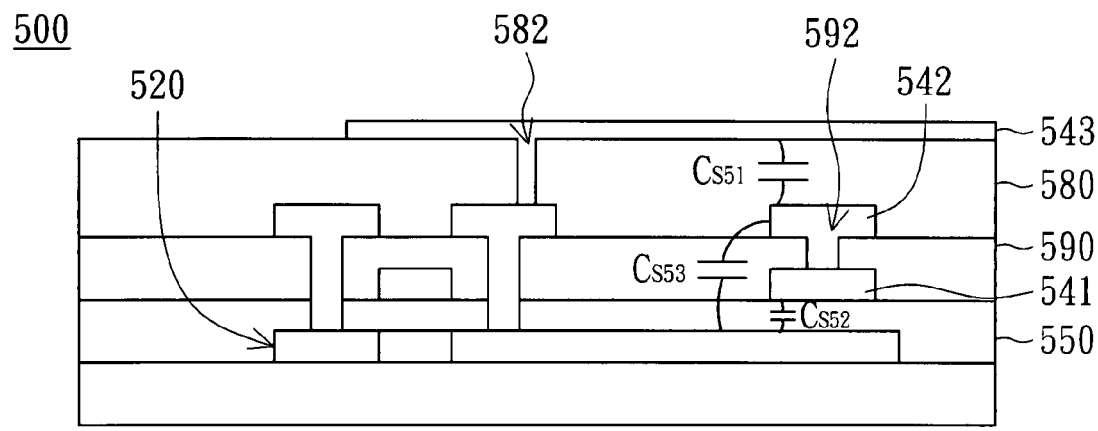
FIG. 7B is a cross-sectional view of the pixel structure of FIG. 7A.

Referring to FIG. 7A, a top view of a pixel structure according to a third embodiment of the present invention is shown. The present embodiment of the invention is exemplified by a pixel structure 500 of a display panel of an electro-optical device. As indicated in FIG. 7A, a data line DT5 line DT5 and a scan line SC5 are electrically connected to the pixel structure 500, respectively. Referring to FIG. 7B, a cross-sectional view of the pixel structure of FIG. 7A is shown. FIG. 7B is a cross-sectional view along the cross-sectional line 7B-7B' of FIG. 7A. The pixel structure 500 comprises a transistor (not numbered in the diagram), a first storage capacitor $C_{s51}$, a second storage capacitor $C_{s52}$, a third storage capacitor $C_{s53}$, a first conductive layer 541, an interlayer dielectric layer 590, a second conductive layer 542, an insulating layer 550, a semiconductor layer 520, a passivation layer 580, and a third conductive layer 543. Preferably, the pixel structure 500 selectively comprises a light-shading patterned layer (not illustrated in the diagram) located and substantially paralleled a side of at least one of the data line DT5 and the scan line SC5, so as to avoid the light-leakage occurring to an edge of at least one of the data line DT5 and the scan line SC5.

The first storage capacitor $C_{s51}$ is electrically connected to the transistor. The interlayer dielectric layer 590 having an opening 592 covers the first conductive layer 541. The second conductive layer 542 is formed on a part of the interlayer dielectric layer 590 and is electrically connected to the first conductive layer 541 through the opening 592. The passivation layer 580 having an opening 582 covers the transistor and the second conductive layer 542. The third conductive layer 543 is formed on a part of the passivation layer 580 and is electrically connected to the transistor through the opening 582. The first storage capacitor $C_{s51}$ is formed by the third conductive layer 543, the passivation layer 580, and the second conductive layer 542. The layer 542. The second storage capacitor $C_{s52}$ is formed by the first conductive layer 541, the insulating layer 550, and a part of the semiconductor layer 520. The third storage capacitor $C_{s53}$ is formed by the second conductive layer 542, the interlayer dielectric layer 590, the insulating layer 550, and a part of the semiconductor layer 520.

Figure 8A:
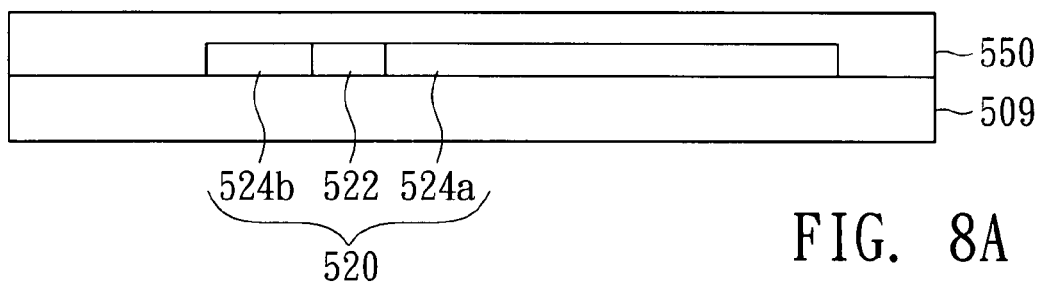
FIGS. 8A~8F are flowcharts of a method for forming the pixel structure of FIG. 7B.

Referring to FIGS. 8A~8F, flowcharts of a method for forming the pixel structure of FIG. 7B are shown. The method for forming the pixel structure 500 is stated below. As indicated in FIG. 8A, a semiconductor layer 520 is formed on a substrate 509, and then the semiconductor layer 520 is covered by an insulating layer 550. The semiconductor layer 520 comprises at least two doping regions 524*a* and 524*b* and an intrinsic region 522. In the present embodiment of the invention, the doping region 524*a* extends to the underneath of the first conductive layer 541 as an exemplification. Generically, the intrinsic region 522 is located between the two doping regions 524*a* and 524*b*. Preferably, the present embodiment of the invention can selectively add at least one additional doping region between the intrinsic region 522 and at least one of the two doping regions 524*a* and 524*b*, and the doping concentration of the additional doping region is substantially less than at least one of the two doping regions 524*a* and 524*b*. The intrinsic region 522 may or may not be doped. If the intrinsic region 522 is doped, preferably, the polarity of the intrinsic region 522 is substantially different from the polarity of the two doping regions 524*a* and 524*b* and the additional doping region. Besides, the two doping regions 524*a* and 524b, the intrinsic region 522 and/or the additional doping region can be selectively formed in the semiconductor layer 520 at the same time or not at the same time. Furthermore, the material of the semiconductor layer 520 comprises a single-crystal silicon-containing material, a micro-crystal silicon-containing material, a poly-crystal silicon-containing material, an amorphous silicon-containing material, a germanium-containing material, other materials, or any combination thereof.

Figure 8B:
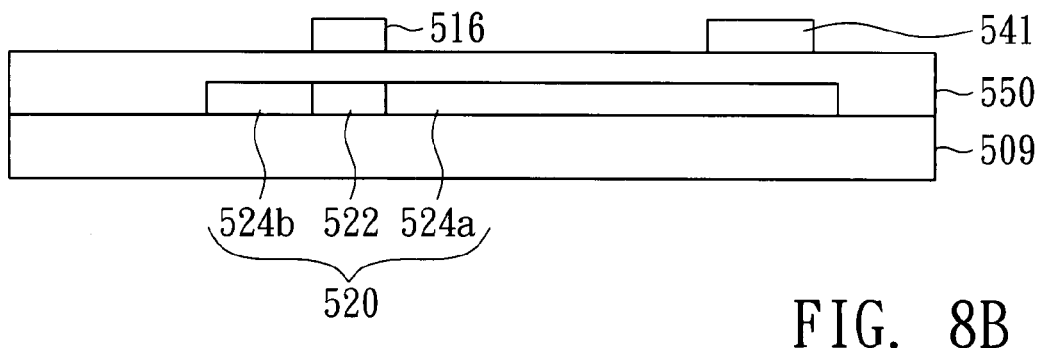

As indicated in FIG. 8B, the first conductive layer 541 is formed on the insulating layer 550; meanwhile, a gate electrode 516 of the transistor is formed. In the present embodiment of the invention, the first conductive layer 541 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The first conductive layer 541 can be selectively made of a transparent material (such as indium tin oxide, aluminum zinc oxide, aluminum tin oxide, indium zinc oxide, cadmium tin oxide, other materials, or any combination thereof) or a combination of a transparent material and a reflective material. Besides, the first conductive layer 541 is connected to an electrode line having potential (such as a common electrode line $V_{com5}$ as indicated in FIG. 7A) but is not limited thereto. A part of an electrode line having potential is used by the first conductive layer 541 (such as the common electrode line $V_{com5}$. is as the first conductive layer 541). In the present embodiment of the invention, the present embodiment of the invention, the common electrode line $V_{com5}$ is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof), but is not limited thereto. The common electrode line $V_{com5}$ can be selectively made of a transparent material (such as indium tin oxide, aluminum zinc oxide, aluminum tin oxide, indium zinc oxide, cadmium tin oxide, other materials, or any combination thereof), or a combination of a transparent material and a reflective material. In other words, the first conductive layer 541 is connected to the electrode line such as the common electrode line $V_{com5}$ made of the substantially identical material to the first conductive layer 541 or the substantially different material from the first conductive layer 541. Preferably, the materials of the electrode line and the first conducitve layer 541 are substantially identical such that the manufacturing process is simplified. As disclosed above, in the present embodiment of the invention, the doping region 524a of the semiconductor layer 520 extends to the underneath of the first conductive layer 541, so the second storage capacitor $C_{s52}$ is formed by the first conductive layer 541, the insulating layer 550, and a part of the semiconductor layer 520. It is noted that the semiconductor layer 520 extending to the underneath of the first conductive layer 541 can be selectively connected to the semiconductor layer 520 disposed under the gate electrode 516 via a connecting layer (not illustrated). The semiconductor layer 520 extending to the underneath of the first conductive layer 541 comprises at least one of the doping regions 524a comprises at least one of the doping regions 524a and 524b, the additional doping region, and the intrinsic region 522. The material of the connecting layer is selected from at least one of the first conductive layer 541, the second conductive layer 542, the third conductive layer 543, and the semiconductor layer 520.

Figure 8C:
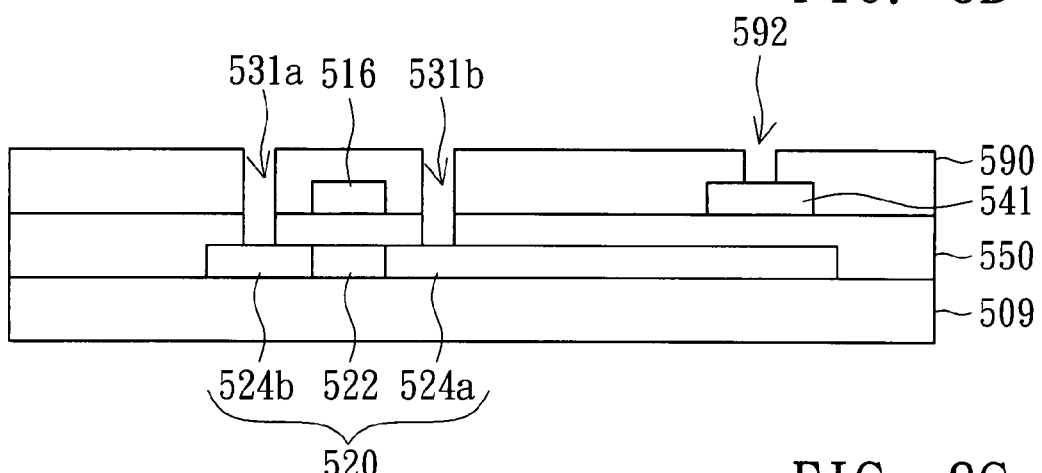
Figure 8D:
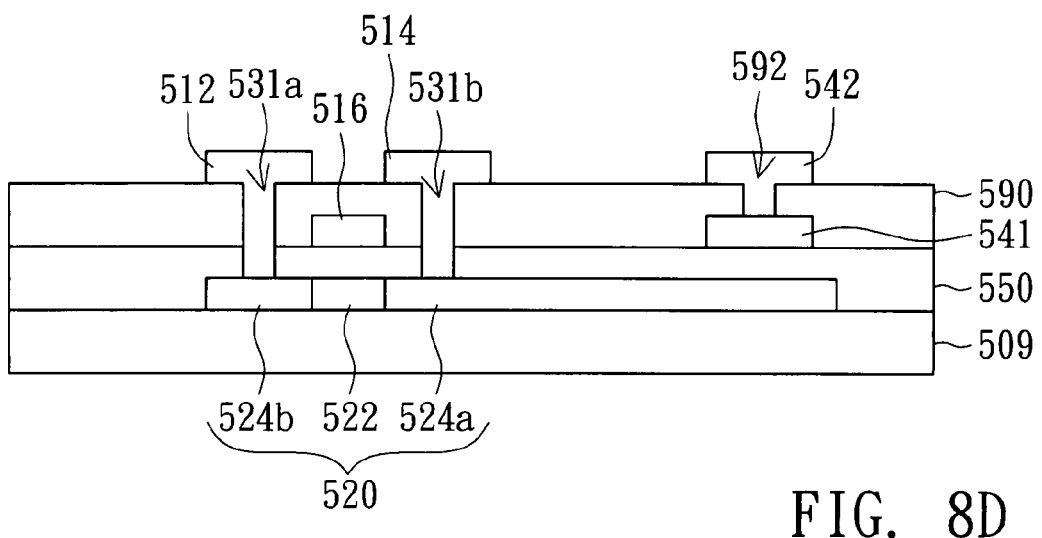

As indicated in FIG. 8C, the insulating layer 550 is covered by the interlayer dielectric layer 590, the opening 592 is formed at the interlayer dielectric layer 590, and two openings 531a and 531b are formed at the interlayer dielectric layer 590 and the insulating layer 550, respectively As indicated in FIG. 8D, the second conductive layer 542 is formed on a part of the interlayer dielectric layer 590 and is electrically connected to the first conductive layer 541 and the semiconductor layer 520 through the opening 592 and the openings 531a and 531b, respectively. The second conductive layer 542 electrically connected to the semiconductor layer 520 through the openings 531a and 531b is as a drain electrode 512 and a source electrode 514 of the transistor, and a gap (not shown) is formed between the drain electrode 512 and the source electrode 514. In the present embodiment of the invention, the second conductive layer 542 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The second conductive layer 542 can be selectively made of a transparent material material (such as indium tin oxide, aluminum zinc oxide, aluminum tin oxide, indium zinc oxide, cadmium tin oxide, other materials, or any combination thereof), or a combination of a transparent material and a reflective material. Furthermore, one of the drain electrode 512 of the transistor and the source electrode 514 of the transistor is electrically connected to the data line DT5 (as indicated in FIG. 7A), and the gate electrode 516 of the transistor is electrically connected to the scan line SC5 (as indicated in FIG. 7A). It is noted that the openings 531a, 531b, and 592 of the present embodiment of the invention are not formed at the same time but are not limited thereto. The openings 531a, 531b, and 592 can be selectively formed at the same time by a photo process with masks having different transparency (such as a halftone mask, a diffracting mask, a grid-patterned mask, other masks, or a combination thereof).

Figure 8E:
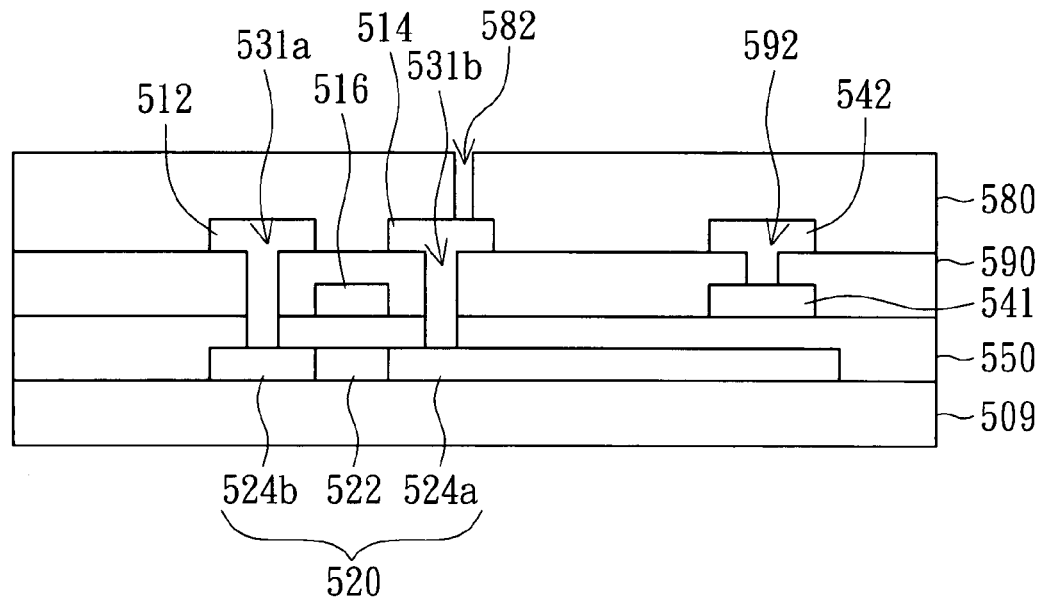

As indicated in FIG. 8E, the passivation layer 580 having the opening 582 covers the transistor and the second conductive layer 542.

Figure 8F:
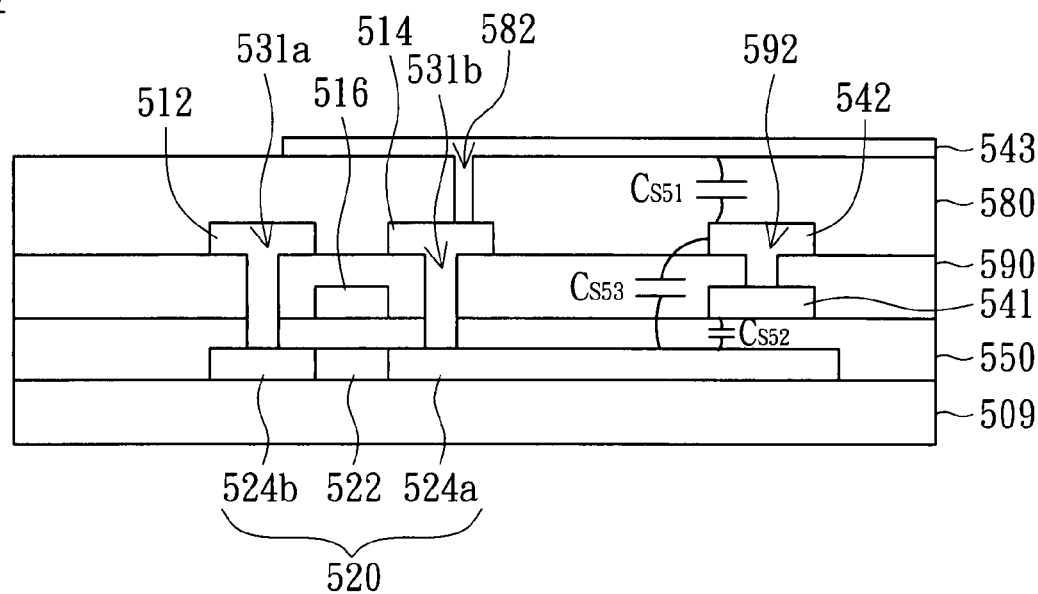

As indicated in FIG. 8F, the third conductive layer 543 (also called the pixel electrode) is formed on a part of the passivation layer 580 and is electrically connected to the transistor through the opening 582. The opening 582 can be substantially aligned with or not aligned with the opening 531b. The third storage capacitor $C_{s53}$ is formed by the second conductive layer 542, the interlayer dielectric layer 590, the insulating layer 550, and a part of the semiconductor layer 520. Thus, the entire pixel structure 500 is like what is illustrated in FIG. 8F. In the present embodiment of the invention, the third the third conductive layer 543 is made of a transparent material (such as indium tin oxide, aluminum zinc oxide, aluminum tin oxide, indium zinc oxide, cadmium tin oxide, other materials, or any combination thereof) but is not limited thereto. The third conductive layer 543 can be selectively made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) or a combination of a transparent material and a reflective material.

In the present embodiment of the invention, the first conductive layer 541 and the second conductive layer 542 are resistors with common potential. That is to say, the first conductive layer 541 and the second conductive layer 542 are connected in parallel, such that the load impedance of the electrode line such as the common electrode line $V_{com5}$ is reduced, hence avoiding cross-talk which occurs when a frame is displayed on the display panel of the electro-optical device. Besides, in the present embodiment of the invention, the doping region 524a of the semiconductor layer 520 extends to the underneath of the first conductive layer 541 for further forming the second storage capacitor $C_{s52}$ and the third storage capacitor $C_{s53}$.

Furthermore, at least one of the insulating layer 550, the interlayer dielectric layer 590, and the passivation layer 580 comprises an inorganic material (such as silicon oxide ($Si_xO_y$), silicon nitride ($Si_xN_y$), silicon oxy-nitride ($SiO_xN_y$), hafnium oxide ($HfO_x$), hafnium nitride ($HfN_x$), silicon carbide (SiC), other materials, or any combination thereof), organic materials (such as photo-resistance, polyarylene ether (PAE), polyimide, polyester, polyglycol, polyolefines, benzocyclclobutene (BCB), hydrogen silsesquioxane (HSQ), methyl silesquioxane (MSQ), SiOC-H, other materials, or any combination thereof), or a combination thereof.

Figure 9:
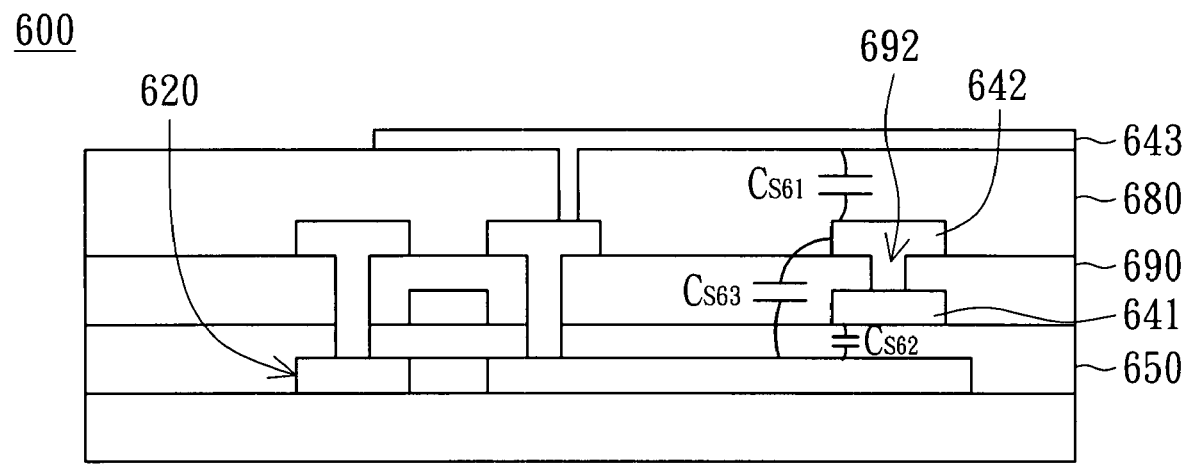
FIG. 9 is a cross-sectional view of another pixel structure of the third embodiment.

In the present embodiment of the invention, the second conductive layer 542 is selectively made of a reflective material, a transparent material, or a combination thereof. The second conductive layer 542 of FIG. 7B is made of a reflective material as an example. Referring to FIG. 9, a cross-sectional view of another pixel structure of the third embodiment is shown. The pixel structure 600 comprises a transistor (not numbered in the diagram), a first storage capacitor $C_{s61}$, a second storage capacitor $C_{s62}$, a third storage capacitor $C_{s63}$, a first conductive layer 641, an interlayer dielectric layer 690, a second conductive layer 642, a semiconductor layer 620, an insulating layer 650, a passivation layer 680 and a third conductive layer 643. The second conductive layer 642 is formed on a part of the interlayer dielectric layer 690 and is electrically connected to the first conductive layer 641 through an opening 692. The second conductive layer 542 of FIG. 7B is made of a reflective material, and the second conductive layer 642 of FIG. 9 is made of a transparent material as an example, but is not limited thereto. The above disclosure is the method for forming the pixel structure 500, the method for forming the pixel structure 600 which is the same with the method for forming same with the method for forming the pixel structure 500 is not repeated here. It is noted that the material of the second conductive layer 542 of the pixel structure 500 is different from the material of the second conductive layer 642 of the pixel structure 600. Similarly, the pixel structure 600 is formed according to the above-mentioned method. As the second conductive layer 642 of the pixel structure 600 is made of a transparent material, the pixel structure 600 is applicable to different embodiments.

Fourth Embodiment

Figure 10A:
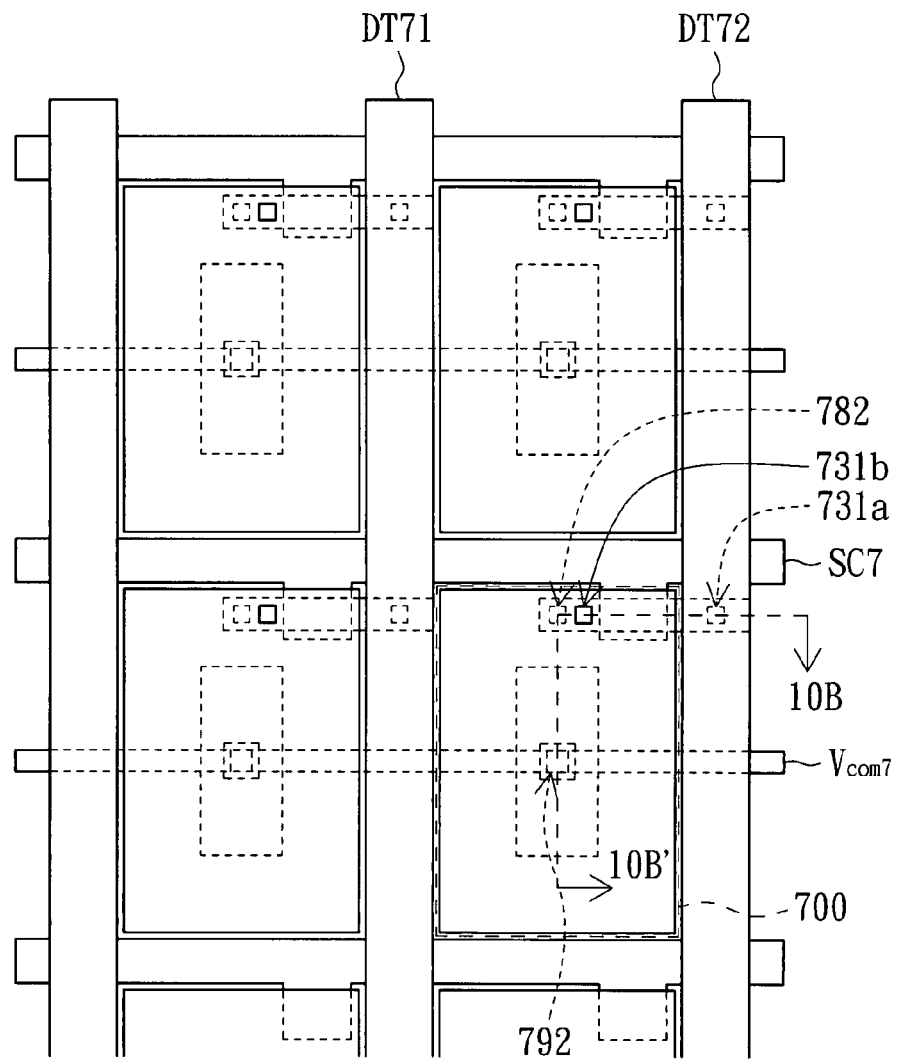
FIG. 10A is a top view of a pixel structure according to a fourth embodiment of the present invention.
Figure 10B:
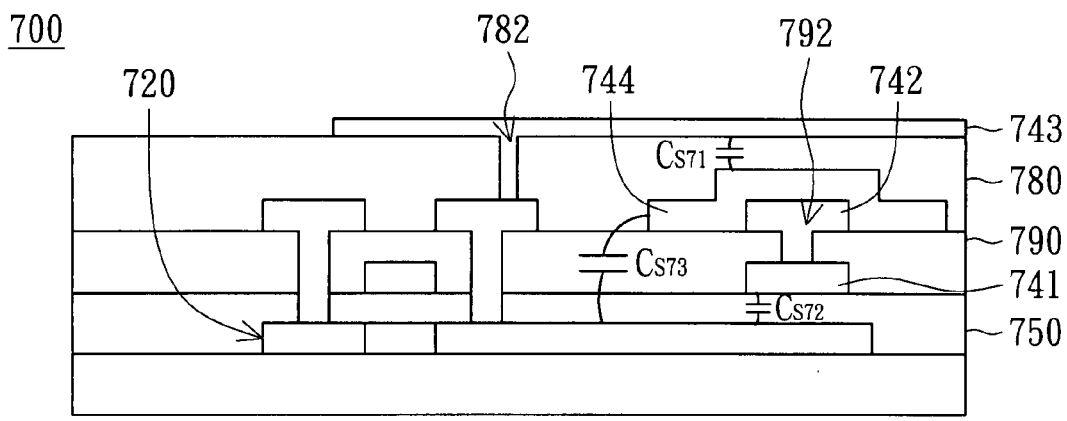
FIG. 10B is a cross-sectional view of the pixel structure of FIG. 10A.

Referring to FIG. 10A, a top view of a pixel structure according to a fourth embodiment of the present invention is shown. The present embodiment of the invention is exemplified by a pixel structure 700 of a display panel of an electro-optical device. As indicated in FIG. 10A, data lines DT71 and DT72 and a scan line SC7 are electrically connected to the pixel structure 700, respectively. Referring to FIG. 10B, a cross-sectional view of the pixel structure of FIG. 10A is shown. FIG. 10B is a cross-sectional view along the cross-sectional line 10B-10B' of FIG. 10A. The pixel structure 700 comprises a transistor (not numbered in the diagram), a first storage capacitor $C_{s71}$, a second storage capacitor $C_{s72}$, a third storage capacitor $C_{s73}$, a first conductive layer 741, an interlayer dielectric layer 790, a second conductive layer 742, a semiconductor layer 720, an insulating layer 750, a passivation layer 780, a third conductive layer 743, and a fourth conductive layer 744. Preferably, the pixel structure 700 selectively comprises a light-shading patterned layer (not illustrated in the diagram) located and substantially paralleled a side of at least located and substantially paralleled a side of at least one of the data lines DT71 and DT72 and the scan line SC7, so as to avoid the light-leakage occurring to an edge of at least one of the data lines DT71 and DT72 and the scan line SC7.

The first storage capacitor $C_{s71}$ is electrically connected to the transistor. The interlayer dielectric layer 790 having an opening 792 covers the first conductive layer 741. The second conductive layer 742 is formed on a part of the interlayer dielectric layer 790 and is electrically connected to the first conductive layer 741 through an opening 792. The passivation layer 780 having an opening 782 covers the transistor and the second conductive layer 742. The third conductive layer 743 is formed on a part of the passivation layer 780 and is electrically connected to the transistor through the opening 782. The fourth conductive layer 744 covers the second conductive layer 742 and a part of the interlayer dielectric layer 790, such that the first storage capacitor $C_{s71}$ is formed by the third conductive layer 743, the passivation layer 780, the fourth conductive layer 744, and the second conductive layer 742. The second storage capacitor $C_{s72}$ is formed by the first conductive layer 741, the insulating layer 750, and a part of the semiconductor layer 720. The third storage capacitor $C_{s73}$ is formed by the second conductive layer 742, the fourth conductive layer 744, the interlayer dielectric layer 790, the insulating layer 750, and a part of the semiconductor layer 720.

Figure 11A:
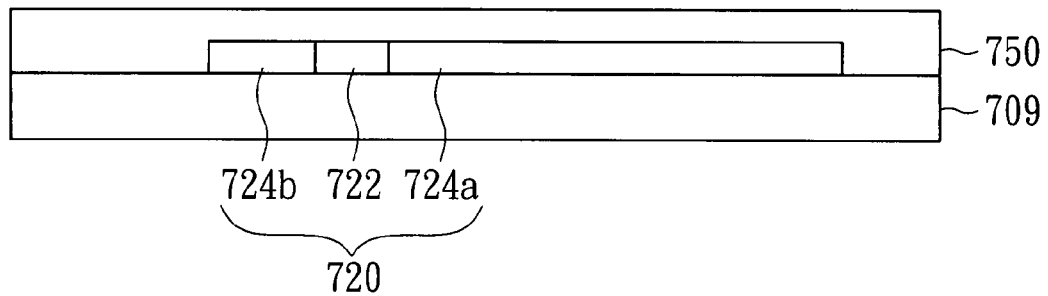
FIGS. 11A~11G are flowcharts of a method for forming the pixel structure of FIG. 10B.

Referring to FIGS. 11A-11G, flowcharts of a method for forming the pixel structure of FIG. 10B are shown. The method for forming the pixel structure 700 is stated below. As indicated in FIG. 11A, the semiconductor layer 720 is formed on a substrate 709, and then the semiconductor layer 720 is covered by the insulating layer 750. The semiconductor layer 720 comprises at least two doping regions 724a and 724b and an intrinsic region 722. In the present embodiment of the invention, the doping region 724a extends to the underneath of the first conductive layer 741 as an exemplification. Generically, the intrinsic region 722 is located between the two doping regions 724a and 724b. Preferably, the present embodiment of the invention can selectively add at least one additional doping region between the intrinsic region 722 and at least one of the two doping regions 724a and 724b, and the doping concentration of the additional doping region is substantially less than at least one of the two doping regions 724a and 724b. The intrinsic region 722 may or may not be doped. If the intrinsic region 722 is doped, preferably, the polarity of the intrinsic region 722 is substantially different from the polarity of the two doping regions 724a and 724b and the additional doping region. Besides, the two doping regions 724a and 724b, the intrinsic region 722 and/or the additional doping region can be selectively formed in the semiconductor layer 720 at the same time or not at the same time. Furthermore, the material of the semiconductor layer 720 comprises a single-crystal silicon-containing material, a micro-crystal silicon-containing material, a poly-crystal silicon-containing material, an amorphous silicon-containing material, a germanium-containing material, other materials, or any combination thereof.

Figure 11B:
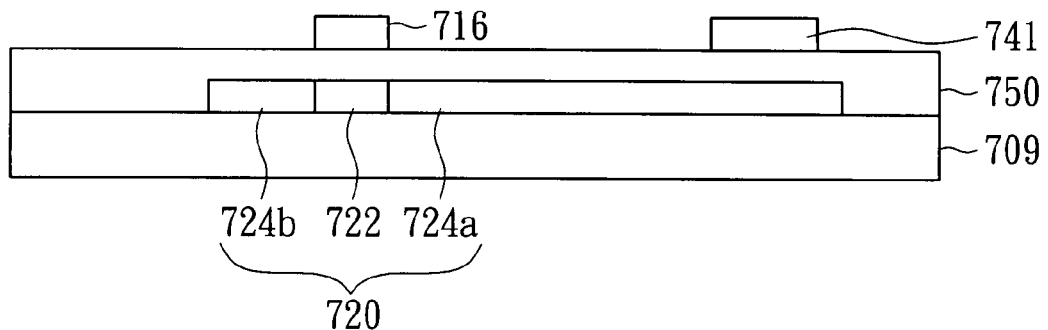

As indicated in FIG. 11B, the first conductive layer 741 is formed on the insulating layer 750; meanwhile, a gate electrode 716 of the transistor is formed. In the present embodiment of the invention, the first conductive layer 741 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The first conductive layer 741 can be selectively made of a transparent material (such as indium tin oxide, aluminum zinc oxide, aluminum tin oxide, indium zinc oxide, cadmium tin oxide, other materials, or any combination thereof) or a combination of a transparent material and a reflective material. Besides, the first conductive layer 741 is connected to an electrode line having potential (such as a common electrode line $V_{com7}$ as indicated in FIG. 10A) but is not limited thereto. A part of an electrode line having potential is used by the first conductive layer 741 (such as the common electrode line $V_{com7}$ is as the first conductive layer 741). In the present embodiment of the invention, the electrode line such as the common electrode line $V_{com7}$ is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof), but is not limited thereto. The electrode line can be selectively made of a transparent material (such as indium tin oxide, aluminum zinc oxide, aluminum tin oxide, indium zinc oxide, cadmium tin oxide, other materials, or any combination thereof), or a combination of a transparent thereof), or a combination of a transparent material and a reflective material. In other words, the first conductive layer 741 is connected to the electrode line such as the common electrode line $V_{com7}$ made of the substantially identical material to the first conductive layer 741 or the substantially different material from the first conductive layer 741. Preferably, the materials of the electrode line and the first conductive layer 741 are substantially identical such that the manufacturing process is simplified. As disclosed above, in the present embodiment of the invention, the doping region 724a of the semiconductor layer 720 extends to the underneath of the first conductive layer 741, so the second storage capacitor $C_{s72}$ is formed by the first conductive layer 741, the insulating layer 750 and a part of the semiconductor layer 720. It is noted that the semiconductor layer 720 extending to the underneath of the first conductive layer 741 can be selectively connected to the semiconductor layer 720 disposed under the gate 716 via a connecting layer (not illustrated). The semiconductor layer 720 or a block which extend to the underneath of the first conductive layer 741 comprises at least one of the doping regions 724a and 724b, the additional doping region, and the intrinsic region 722. The material of the connecting layer is selected from at least one of the first conductive layer 741, the second conductive layer 742, the third conductive layer 743, and the semiconductor layer 720.

Figure 11C:
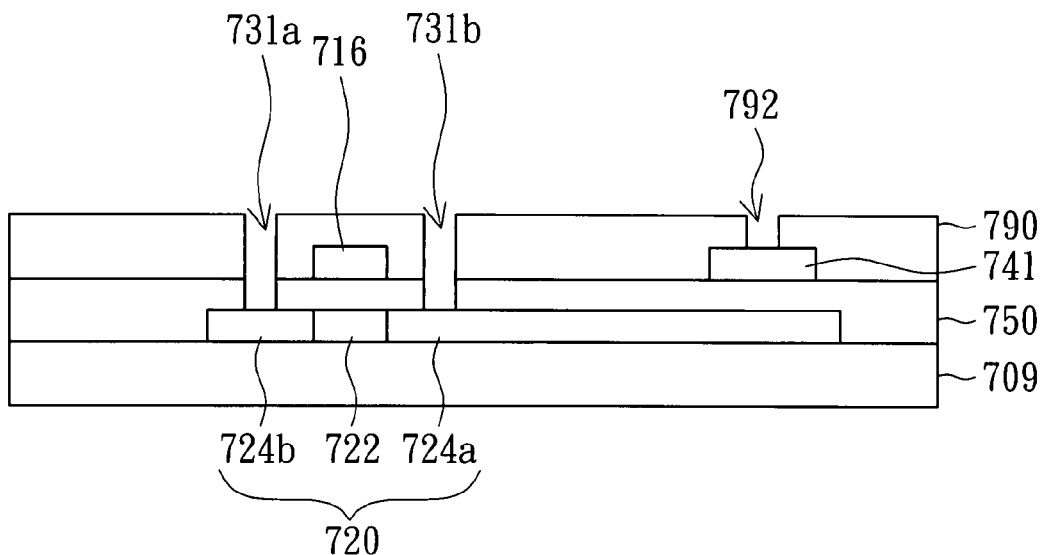

As indicated in FIG. 11C, the insulating layer 750 is covered by the interlayer dielectric layer 790, the opening 792 is formed at the interlayer dielectric layer 790, and two openings 731a and 731b are formed at the interlayer dielectric layer 790 and the insulating layer 750, respectively.

Figure 11D:
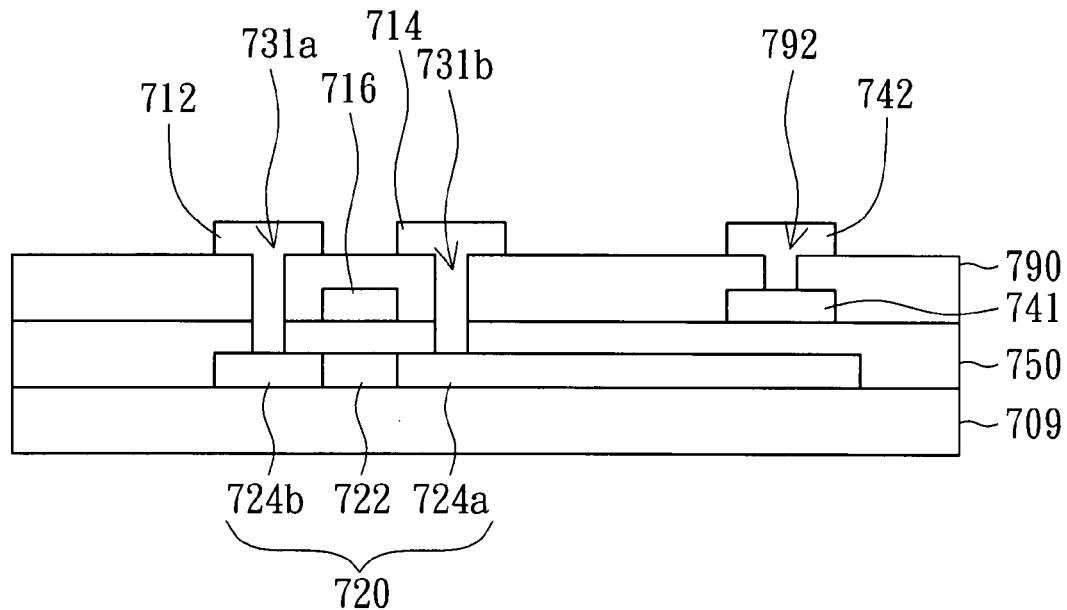

As indicated in FIG. 11D, the second conductive layer 742 is formed on a part of the interlayer dielectric layer 790 and is electrically connected to the first conductive layer 741 and the semiconductor layer 720 through the opening 792 and the openings 731a and 731b, respectively. The second conductive layer 742 electrically connected to the semiconductor layer 720 through the openings 731a and 731b is as a drain electrode 712 of the transistor and a source electrode 714 of the transistor, and a gap (not shown) is formed between the drain electrode 712 and the source electrode 714. In the present embodiment of the invention, the second conductive layer 742 is made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) but is not limited thereto. The second conductive layer 742 can be selectively made of a transparent material (such as indium tin oxide, aluminum zinc oxide, aluminum tin oxide, indium zinc oxide, cadmium tin oxide, other materials, or any combination thereof), or a combination of a transparent material and a reflective material. The drain electrode 712 of the transistor and the source electrode 714 of the transistor are electrically connected to the semiconductor layer 720 via the openings 731a and 731b, respectively. Furthermore, one of the drain electrode 712 of the transistor and the source electrode 714 of the transistor is electrically connected to the data lines DT71 and DT72 (as indicated in FIG. 10A), and the 10A), and the gate electrode 716 of the transistor is electrically connected to the scan line SC7 (as indicated in FIG. 10A). It is noted that the openings 731a, 731b and 792 of the present embodiment of the invention are not formed at the same time but are not limited thereto. The openings 731a, 731b and 792 can be selectively formed at the same time by a photo process with masks having different transparency (such as a halftone mask, a diffracting mask, a grid-patterned mask, other masks, or a combination thereof).

Figure 11E:
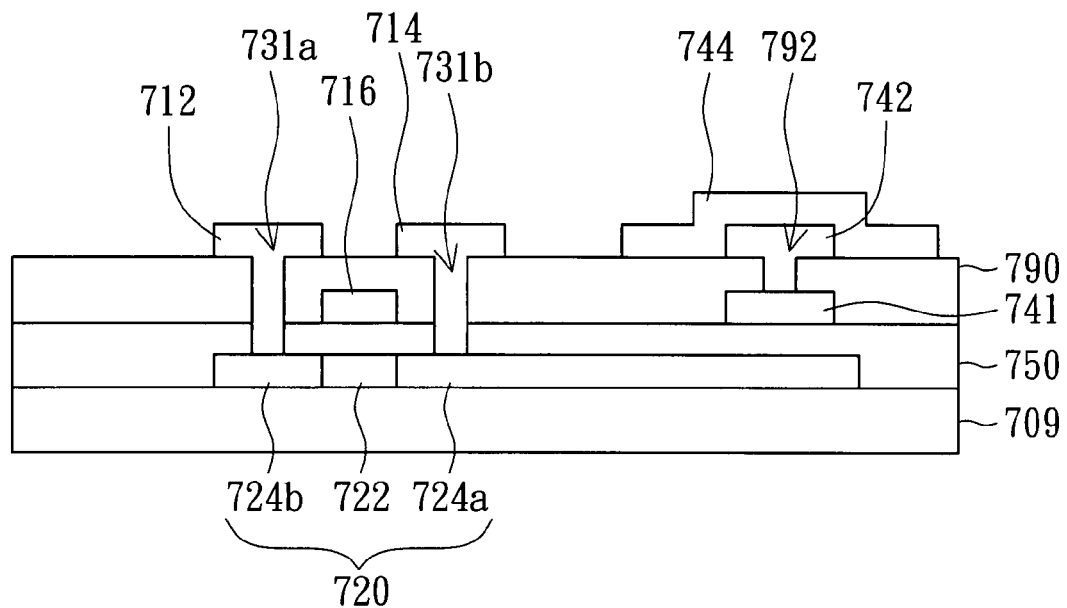

As indicated in FIG. 11E, the fourth conductive layer 744 covers the second conductive layer 742 and a part of the interlayer dielectric layer 790. In the present embodiment of the invention, the fourth conductive layer 744 is made of a transparent material but is not limited thereto. The fourth conductive layer 744 can be selectively made of a reflective material or a combination of a transparent material and a reflective material. Besides, the first conductive layer 741, the second conductive layer 742, and the fourth conductive layer 744 are electrically connected together, so the first conductive layer 741, the second conductive layer 742 and the fourth conductive layer 744 have substantially identical potential, for example, the first conductive layer 741, the potential of the second conductive layer 742 and the fourth conductive layer 744 is the common potential.

Besides, in the present embodiment of the invention, there is a first parasitic capacitance between the drain electrode 712 and the scan line SC7, and the sum of the capacitance between the drain electrode 712 and each of the data lines DT71 and DT72 is substantially equal to a second parasitic capacitance. In the pixel structure 700, there is a liquid crystal capacitance (not illustrated) between a pixel electrode and a common electrode (not illustrated) formed on another substrate (not shown) corresponding to the substrate 709. A pixel capacitance of the pixel structure 700 is substantially equal to the sum of the liquid crystal capacitance and the first storage capacitor $C_{s71}$. The area of the fourth conductive layer 744 is determined according to the ratio of the first parasitic capacitance to the pixel capacitance, the ratio of the second parasitic capacitance to the pixel capacitance, and the ratio of the first storage capacitor $C_{s71}$ to the liquid crystal capacitance. In the present embodiment of the invention, preferably, the area of the fourth conductive layer 744 is substantially greater than the area of the second conductive layer 742, but is not limited thereto. The area of the fourth conductive layer 744 can be selectively changed according to design requirements. For example, the area of the fourth conductive layer 744 is substantially less than the area of the second conductive layer 742, substantially equal to the area of the second conductive layer 742, or the area of a part of the fourth conductive layer 744 is substantially greater than the area of the second conductive layer 742 and the area of another part of the fourth conductive layer 744 is substantially less than or substantially equal to the area of the second conductive layer 742.

Figure 11F:
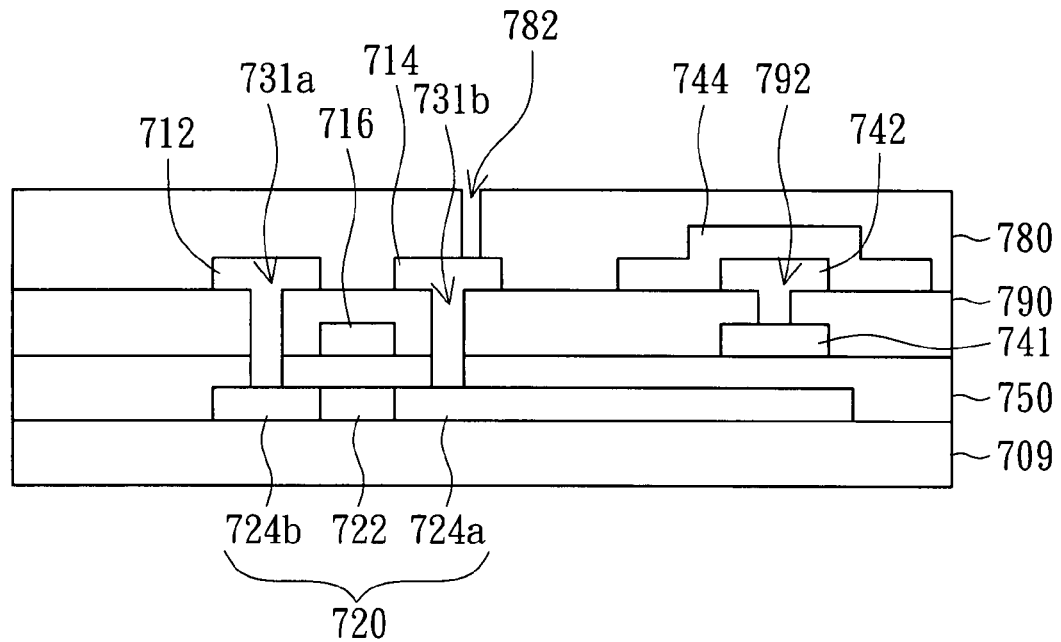

As indicated in FIG. 11F, the passivation layer 780 having the opening 782 covers the transistor and the second conductive layer 742.

Figure 11G:
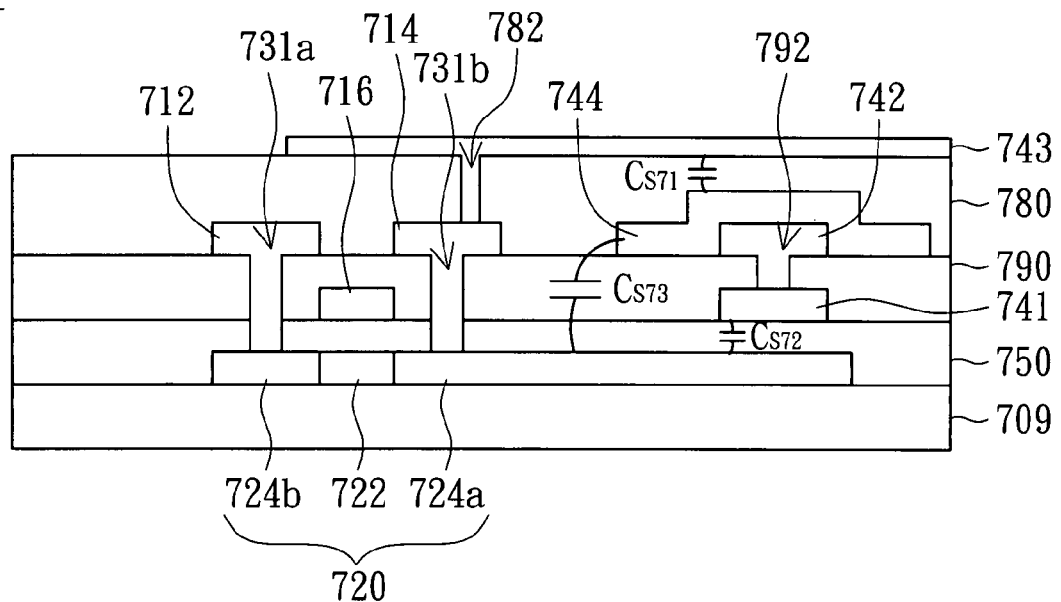

As indicated in FIG. 11G, the third conductive layer 743 (also called the pixel electrode) is formed on a part of the passivation layer 780 and is electrically connected to the transistor through the opening 782. The opening 782 can be substantially aligned with or not aligned with the opening 731b. The third storage capacitor $C_{s73}$ is formed by the second conductive layer 742, the interlayer dielectric layer 790, the insulating layer 750, and a part of the semiconductor layer 720. Thus, the entire pixel structure 700 is like what is illustrated in FIG. 11G. In the present embodiment of the invention, the third conductive layer 743 is made of a transparent material (such as indium tin oxide, aluminum zinc oxide, aluminum tin oxide, indium zinc oxide, cadmium tin oxide, other materials, or any combination thereof) but is not limited thereto. The third conductive layer 743 can be selectively made of a reflective material (such as gold, silver, copper, iron, tin, lead, cadmium, molybdenum, tungsten, neodymium, titanium, tantalum, hafnium, other materials, the above oxides, the above nitrides, the above oxy-nitrides, the above alloys, or any combination thereof) or a combination of a transparent material and a reflective material.

In the present embodiment of the invention, the fourth conductive layer 744 is made of a transparent material, so the pixel structure 700 is adapted to increase the aperture ratio without changing the capacitance of the storage capacitors, but is not limited thereto. The fourth conductive layer 744 can also be made of a reflective material, or a combination of a transparent material and a reflective material. Besides, the fourth conductive layer 744 layer 744 can select not to overlap any gate lines or data lines to reduce the load of the gate line or the data line but is not limited thereto. The fourth conductive layer 744 can be selectively partly overlapped.

Furthermore, the first conductive layer 741, the second conductive layer 742, and the fourth conductive layer 744 are resistors with common potential. That is to say, the first conductive layer 741 the second conductive layer 742 and the fourth conductive layer 744 are connected in parallel, such that the load impedance of the electrode line such as the common electrode line $V_{com7}$ is reduced, hence avoiding cross-talk which occurs when a frame is displayed on the display panel of the electro-optical device.

Besides, in the present embodiment of the invention, the doping region 724a of the semiconductor layer 720 extends to the underneath of the first conductive layer 741 for further forming the second storage capacitor $C_{s72}$ and the third storage capacitor $C_{s73}$.

Furthermore, at least one of the insulating layer 750, the interlayer dielectric layer 790, and the passivation layer 780 comprises an inorganic material (such as silicon oxide ($Si_xO_y$), silicon nitride ($Si_xN_y$), silicon oxy-nitride ($Si_xO_xN_y$), hafnium oxide ($HfO_x$), hafnium nitride ($HfN_x$), silicon carbide (SiC), other materials, or any combination thereof), organic materials (such as photo-resistance, polyarylene ether (PAE), polyimide, polyester, polyglycol, polyolefines, benzocyclclobutene (BCB), hydrogen silsesquioxane (HSQ), methyl silesquioxane (MSQ), SiOC-H, other materials, or any combination thereof), or a combination thereof.

The pixel structure disclosed in the above-mentioned embodiments of the present invention has at least one storage capacitor between conductive materials. In the above-mentioned embodiments, the conductive material comprises a transparent material, a reflective material, or a combination thereof. For example, in the above-mentioned embodiments, the fourth conductive layers 444 and 744 are made of a transparent material, so the pixel structures 400 and 700 can maintain the original capacitance and further increase the aperture ratio. Besides, the fourth conductive layers 444 and 744 are selectively disposed without overlapping any gate lines or data lines. Therefore, in addition to the above-mentioned advantages, such as maintaining the original capacitance and further increasing the aperture ratio, the fourth conductive layers 444 and 744 can also reduce the load of the gate lines or the data lines, but is not limited thereto. The fourth conductive layers 444 and 744 can be selected to partly overlap.

Furthermore, the first conductive layers and the second conductive layers of the first embodiment and the third embodiment are resistors with common potential. That is to say, the first conductive layers and the second conductive layers of the first embodiment and the third embodiment are connected in parallel. The first conductive layers, the second conductive layers, and the fourth conductive layers of the second embodiment and the forth embodiment are resistors with common potential. That is to say, the first conductive layers, the second conductive layers, and the fourth conductive layers of the second embodiment and the forth embodiment are connected in parallel. Therefore, the application of the above-mentioned embodiments can reduce the load impedance of electrode lines, hence avoiding cross-talk which occurs when the frame is displayed on the display panel of the electro-optical device.

Besides, in the above-mentioned embodiments of the present invention, the electrode line having potential is exemplified by a common electrode line ($V_{com}$) having common potential but is not limited thereto, and an electrode line having variable potantial or other potantial (such as gate potantial or other potantial) will do as well.

Figure 12:
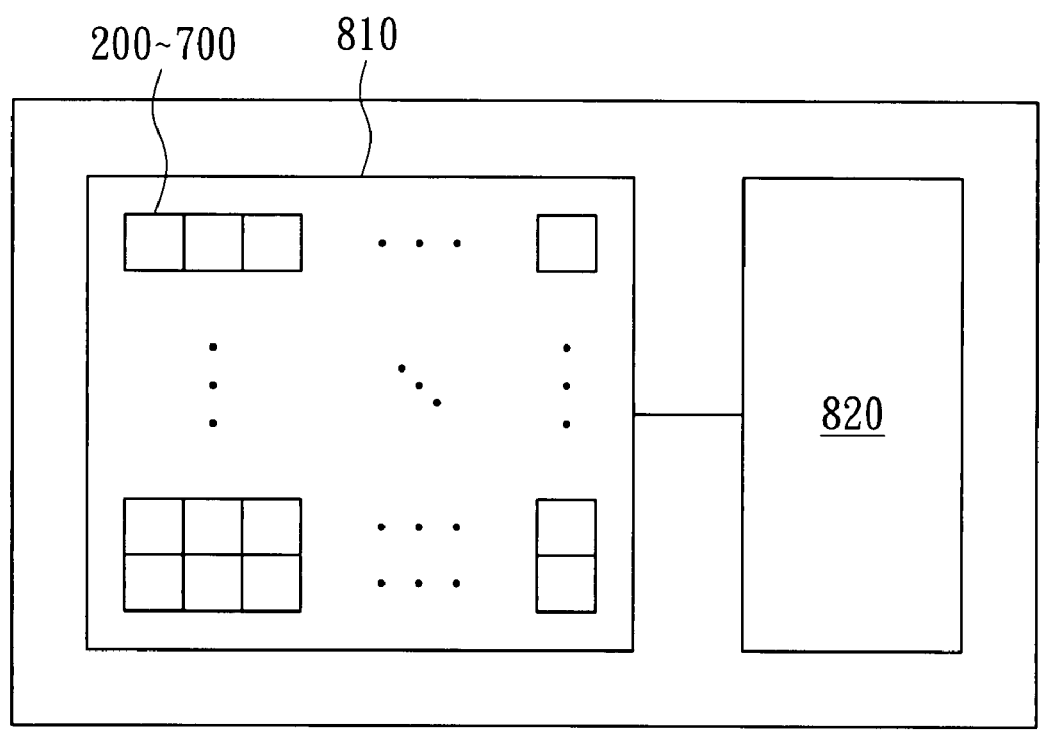
FIG. 12 is a perspective of an electro-optical device of the present invention.

FIG. 12 is a perspective of an electro-optical device of the present invention. The electro-optical device 800 incorporates with the pixel structures 200~700 of the above-mentioned embodiments. The electro-optical device 800 includes an electronic element 820 connected to a display panel 810. Examples of the electronic element 820 comprise a controlling element, an operating element, a processing element, an inputting element, a memory element, a driving element, an illuminating element, a protecting element, a sensing element, a detecting element, elements of other functions, or any combination thereof. Examples of the electro-optical device 800 comprise portable electronic products (such as a mobile phone, a video camera, a notebook, a game station, a watch, a music player, an electronic photo-frame, an e-mail transceiver, a global positioning device, or similar similar products), an audio-video device (such as a video-sound player, or likes), a screen, a television, an indoor/outdoor billboard, a panel of a projector, and so on. Besides, examples of the display panel 810 comprise a liquid crystal display panel (such as a transmissive panel, a semi-transmissive panel, a reflective panel, a dual display panel, a vertical alignment (VA) panel, an in-plane switching (IPS) panel, a multi-domain vertical alignment (MVA) panel, a twisted nematic (TN) panel, a super twisted nematic (STN) panel, a patterned vertical alignment (PVA) panel, a super patterned vertical alignment (S-PVA) panel, an advanced super view (ASV) panel, a fringe-field switching (FFS) panel, a continuous pinwheel alignment (CPA) panel, an axial symmetry micelle (ASM) panel, an optical compensation bend (OCB) panel, a super in-plane switching (S-IPS) panel, an advanced super in-plane switching (AS-IPS) panel, a ultra fringe-field switching (UFFS) panel, a polymer stabilization alignment (PSA)

panel, a dual-view panel, a triple-view panel, a color filter on array (COA) panel, an array on color filter (AOC) panel, other panels, or any combination thereof.), an organic electroluminescent display panel, and a semi-self-illuminant liquid crystal display panel. The above-mentioned types of the display panel are depended on the material that at least one of the pixel electrode and the drain of the display panel 810 electrically contacts with, such as a liquid crystal layer or an organic electroluminescent layer (such as micro-molecule, high polymer, or a combination thereof), or a combination thereof.

While the present invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pixel structure, comprising:
    at least one transistor;
    a first storage capacitor electrically connected to the transistor;
    a first conductive layer;
    an interlayer dielectric layer, covering the first conductive layer, and having at least one first opening;
    a second conductive layer, formed on a part of the interlayer dielectric layer, and electrically connected to the first conductive layer through the first opening;
    a passivation layer, covering the transistor and the second conductive layer, and having at least one second opening
    a third conductive layer, formed on a part of the passivation layer, and electrically connected to the first conductive layer through the first opening; and
    a fourth conductive layer covering the second conductive layer and a part of the interlayer dielectric layer, such that the first storage capacitor is formed by the third conductive layer, the passivation layer, the fourth conductive layer, and the second conductive layer.

2. The pixel structure according to claim 1, further comprising:
    a semiconductor layer; and
    an insulating layer, covering the semiconductor layer, and having at least two third openings.

3. The pixel structure according to claim 2, further comprising:
    a second storage capacitor formed by the first conductive layer, the insulating layer, and a part of the semiconductor layer.

4. The pixel structure according to claim 3, further comprising:
    a third storage capacitor formed by the second conductive layer, the fourth conductive layer, the interlayer dielectric layer, the insulating layer, and the part of the semiconductor layer.

5. The pixel structure according to claim 1, wherein the first conductive layer, the second conductive layer, and the fourth conductive layer have substantially identical potential.

6. The pixel structure according to claim 1, wherein potential of the first conductive layer, the second conductive layer, and the fourth conductive layer is common potential.

7. The pixel structure according to claim 1, further comprising:
    a semiconductor layer; and
    an insulating layer, covering the semiconductor layer, and having at least two third openings.

8. The pixel structure according to claim 7, further comprising:
    a second storage capacitor formed by the first conductive layer, the insulating layer, and a part of the semiconductor layer.

9. The pixel structure according to claim 8, further comprising:
    a third storage capacitor formed by the second conductive layer, the interlayer dielectric layer, the insulating layer, and the part of the semiconductor layer.

10. The pixel structure according to claim 1, wherein the first conductive layer is connected to a common electrode line.

11. A display panel incorporating a plurality of pixel structures of claim 1.

12. An electro-optical device incorporating the display panel of claim 11.

* * * * *

UNITED STATES PATENT AND TRADEMARK OFFICE
CERTIFICATE OF CORRECTION

| | | |
|---|---|---|
| PATENT NO. | : 7,745,825 B2 | Page 1 of 1 |
| APPLICATION NO. | : 11/902229 | |
| DATED | : June 29, 2010 | |
| INVENTOR(S) | : Yu-Hsin Ting | |

It is certified that error appears in the above-identified patent and that said Letters Patent is hereby corrected as shown below:

Col. 19, lines 33-34 (claim 1, lines 14-15), change "first conductive layer" to --transistor--.

Col. 19, line 34 (claim 1, line 15), change "first opening" to --second opening--.

Col. 20, lines 20-24 (claim 7), delete in their entirety.

Col. 20, lines 25-29 (claim 8), delete in their entirety.

Col. 20, line 30 (claim 9, line 1), change "claim 8" to --claim 3--.

Signed and Sealed this
Twentieth Day of March, 2012

David J. Kappos
*Director of the United States Patent and Trademark Office*